US008885145B2

(12) United States Patent
Sandstrom

(10) Patent No.: US 8,885,145 B2
(45) Date of Patent: *Nov. 11, 2014

(54) IMAGE READING AND WRITING USING A COMPLEX TWO-DIMENSIONAL INTERLACE SCHEME

(71) Applicant: Micronic Mydata AB, Taby (SE)

(72) Inventor: Torbjorn Sandstrom, Täby (SE)

(73) Assignee: Micronic Mydata AB, Taby (SE)

(*) Notice: Subject to any disclaimer, the term of this patent is extended or adjusted under 35 U.S.C. 154(b) by 0 days.

This patent is subject to a terminal disclaimer.

(21) Appl. No.: 13/734,741

(22) Filed: Jan. 4, 2013

(65) Prior Publication Data
US 2013/0188166 A1    Jul. 25, 2013

Related U.S. Application Data

(63) Continuation of application No. 12/626,581, filed on Nov. 25, 2009, now Pat. No. 8,351,020.

(60) Provisional application No. 61/118,299, filed on Nov. 26, 2008.

(51) Int. Cl.
| | | |
|---|---|---|
| *G03B 27/54* | (2006.01) | |
| *G03B 27/32* | (2006.01) | |
| *G06K 17/00* | (2006.01) | |
| *G03F 7/20* | (2006.01) | |
| *G02B 26/08* | (2006.01) | |
| *G02B 5/00* | (2006.01) | |
| *G02B 3/00* | (2006.01) | |

(52) U.S. Cl.
CPC ............ *G06K 17/00* (2013.01); *G02B 26/0833* (2013.01); *G02B 5/003* (2013.01); *G03F 7/70291* (2013.01); *G02B 3/0037* (2013.01)
USPC .............................................. 355/67; 355/77

(58) Field of Classification Search
CPC .................. G03F 7/70291; G02B 26/0833
USPC .............................................. 355/53, 77, 67
See application file for complete search history.

(56) References Cited

U.S. PATENT DOCUMENTS

| | | | |
|---|---|---|---|
| 6,248,988 B1* | 6/2001 | Krantz | 250/201.3 |
| 7,136,087 B2 | 11/2006 | Okuyama et al. | |
| 8,351,020 B2* | 1/2013 | Sandstrom | 355/67 |

FOREIGN PATENT DOCUMENTS

| | | |
|---|---|---|
| JP | 2003084444 A | 3/2003 |
| JP | 2004012899 A | 1/2004 |
| JP | 2004258294 A | 9/2004 |

*Primary Examiner* — Peter B Kim
(74) *Attorney, Agent, or Firm* — Haynes Beffel & Wolfeld LLP; Ernest J. Beffel, Jr.

(57) ABSTRACT

The current invention relates to writing or reading a pattern on a surface, such as in microlithography or inspection of mircrolithographic patterns. In particular, Applicant discloses systems recording or reading images by scanning sparse 2D point arrays or grids across the surface, e.g., multiple optical, electron or particle beams modulated in parallel. The scanning and repeated reading or writing creates a dense pixel or spot grid on the workpiece. The grid may be created by various arrays: arrays of light sources, e.g., laser or LED arrays, by lenslet arrays where each lenslet has its own modulator, by aperture plates for particle beams, or arrays of near-field emitters or mechanical probes. For reading systems, the point grid may be created by a sparse point matrix illumination and/or a detector array where each detector element sees only one spot. The idea behind the use of large arrays is to improve throughput. However, the throughput does not scale with the array size, since above a certain size of arrays, previously known schemes fall into in their own tracks and start repeating the same data over and over again. This application discloses methods to scan workpieces with large arrays while preserving the scaling of throughput proportional to array size, even for very large arrays, in fact essentially without limits.

19 Claims, 29 Drawing Sheets

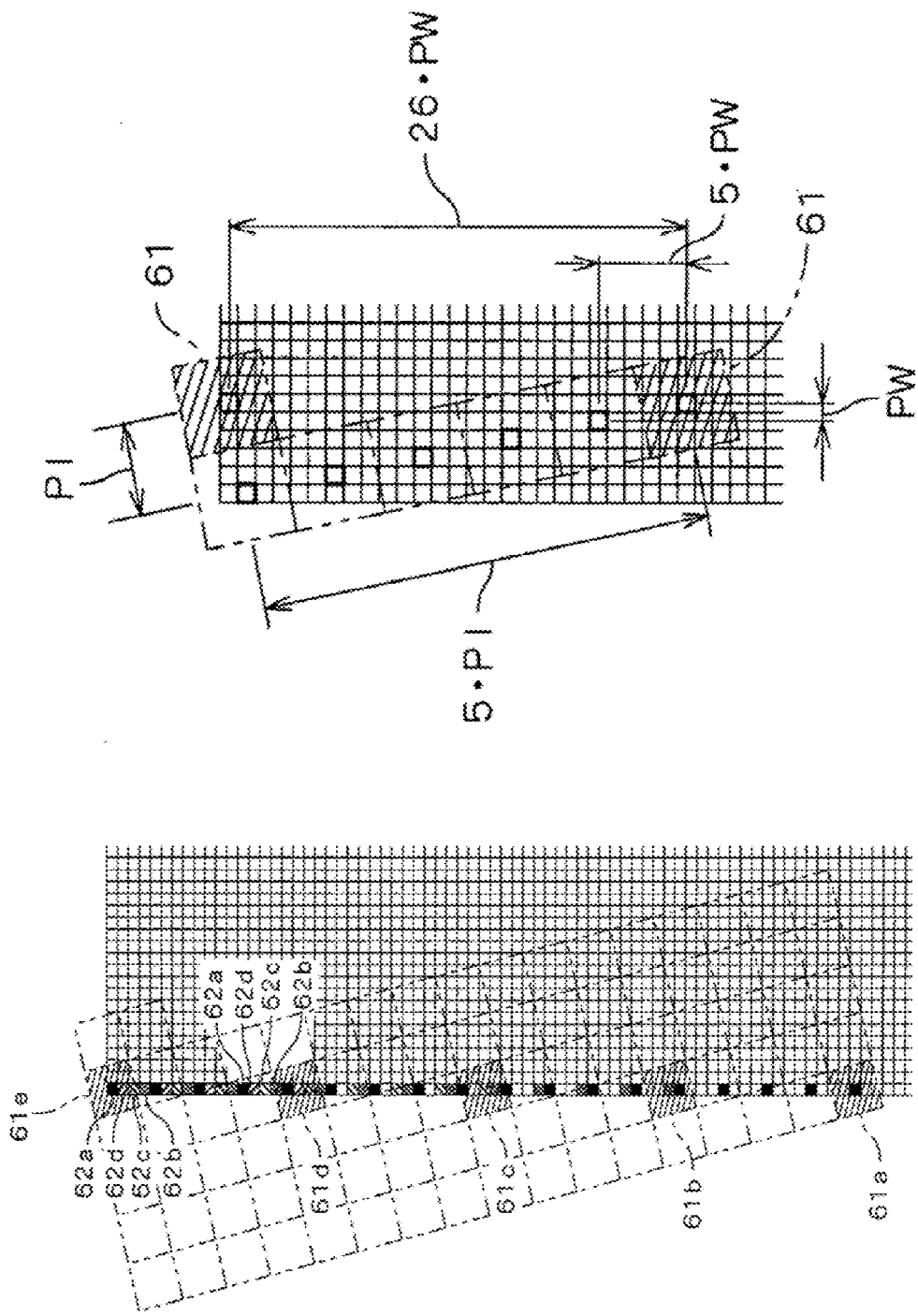
Figure 1d — Prior art US 6,903,798

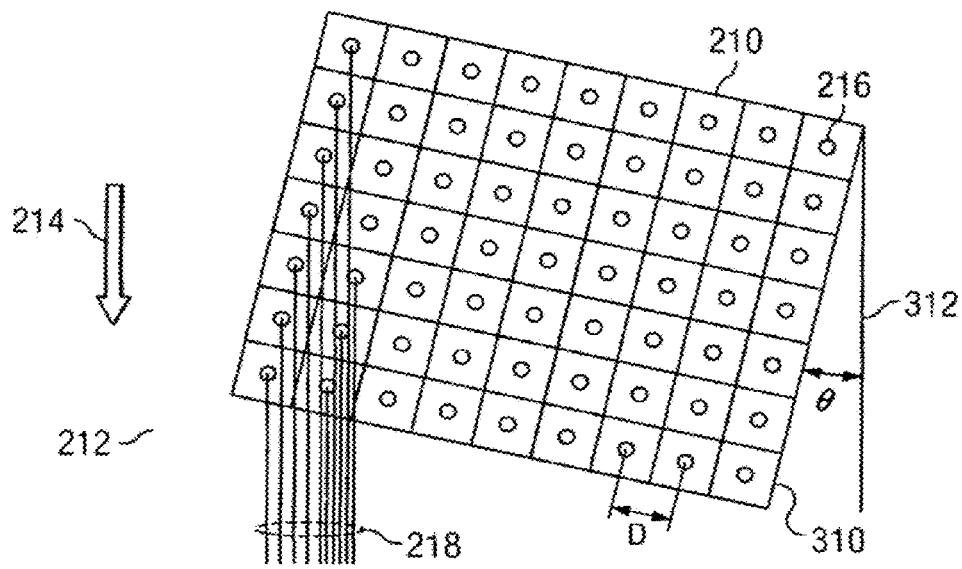
Figure 1f
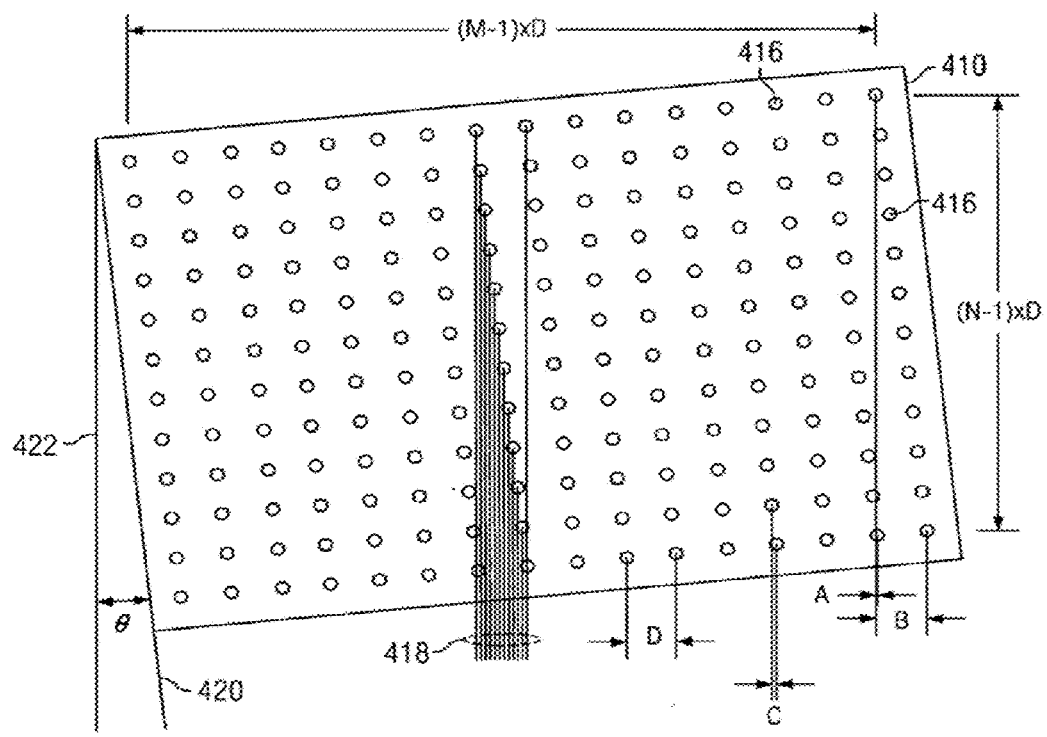
Prior art

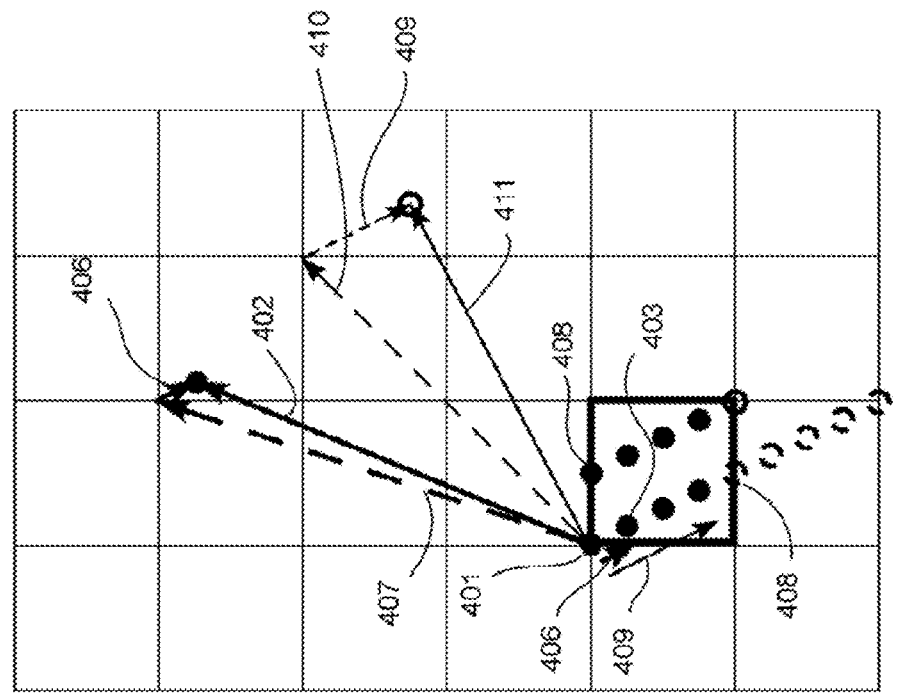
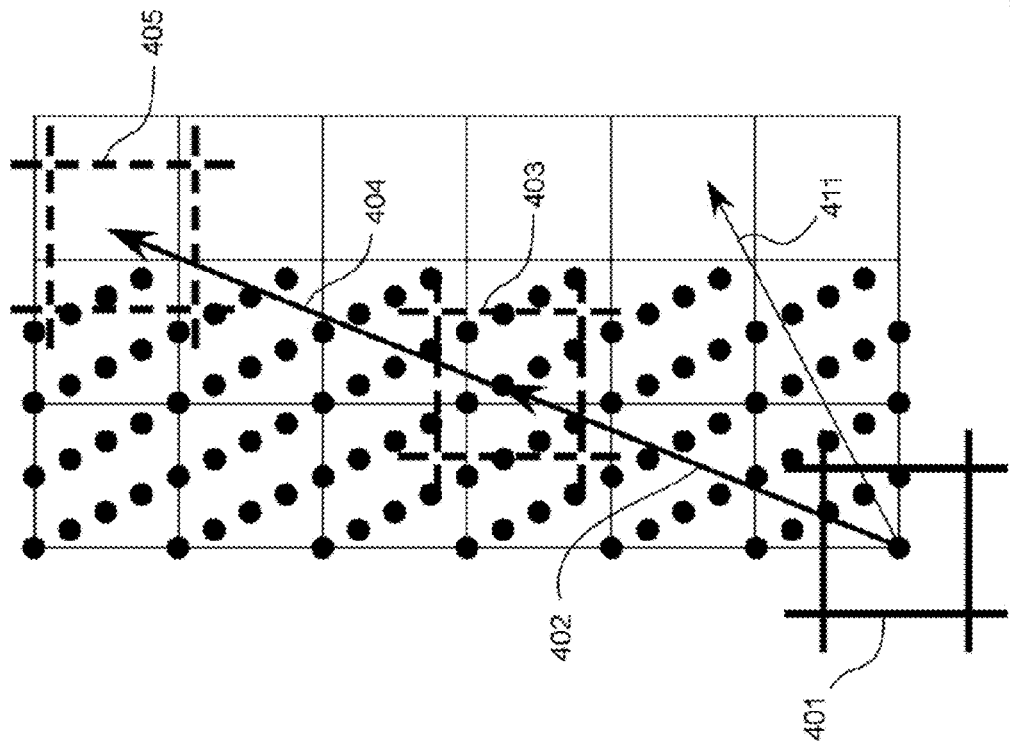
Figure 4b
Figure 4a

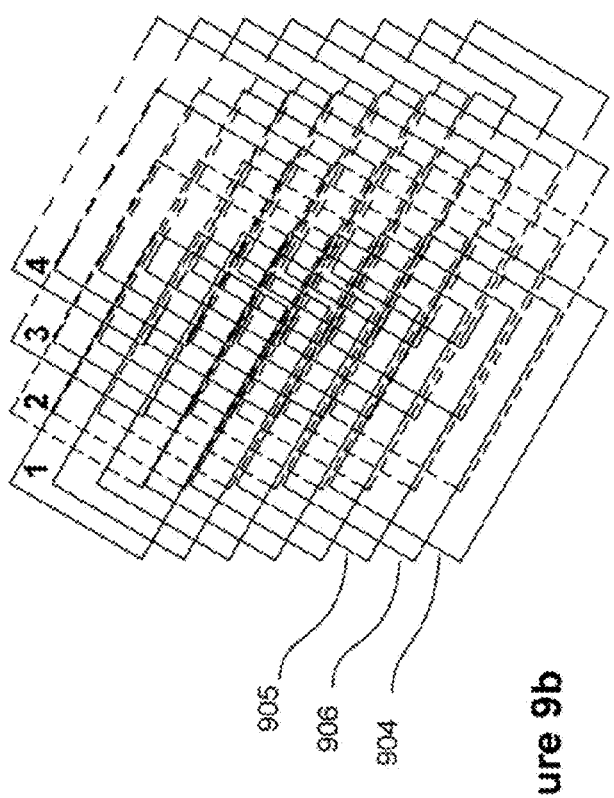
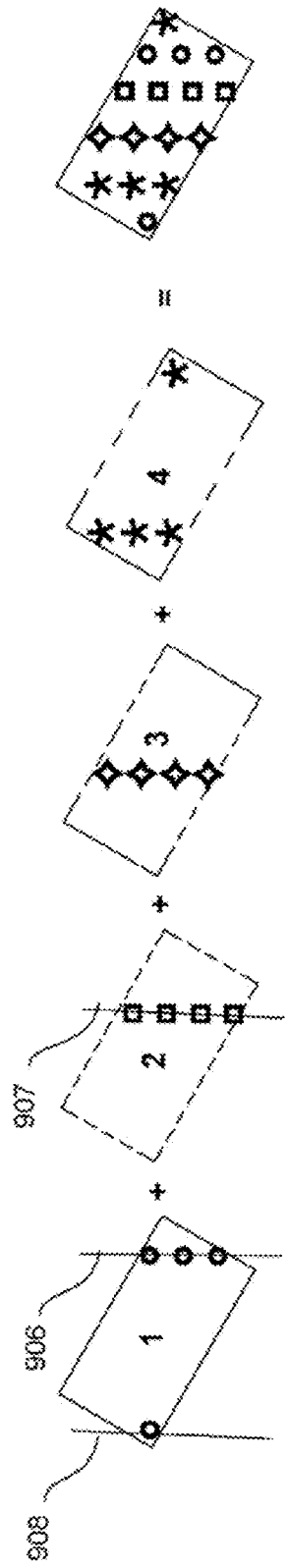
Figure 9b
Figure 9c

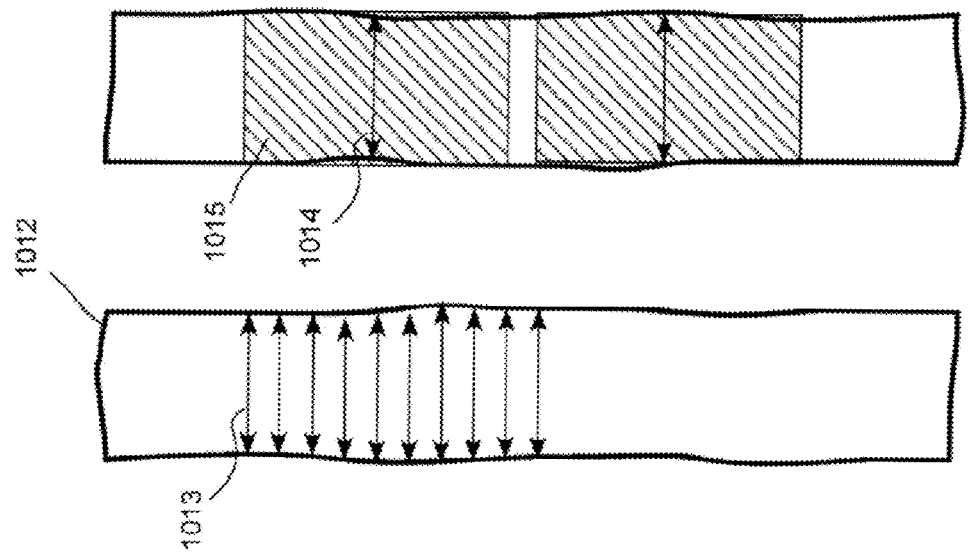
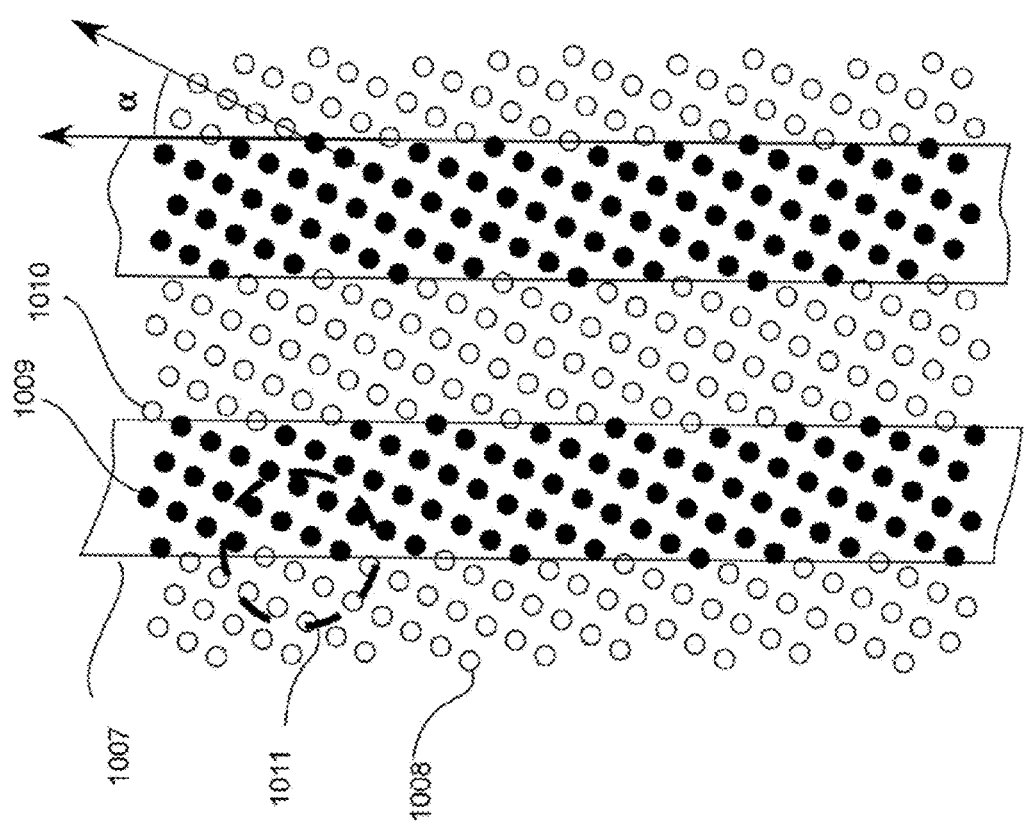

IMAGE READING AND WRITING USING A COMPLEX TWO-DIMENSIONAL INTERLACE SCHEME

RELATED APPLICATION

This application is a continuation of U.S. patent application Ser. No. 12/626,581, which will be patented as U.S. Pat. No. 8,351,020, which in turn is related to and claims the benefit of U.S. Provisional Patent Application No. 61/118, 299, entitled, "Image Reading and Writing Using a Complex Two-Dimensional Interlace Scheme," filed on Nov. 26, 2008. The related applications are incorporated by reference.

BACKGROUND OF THE INVENTION

The technology disclosed relates to writing or reading a pattern on a surface, such as in microlithography or inspection of mircrolithographic patterns. In particular, Applicant discloses systems recording or reading images by scanning sparse 2D point arrays or grids across the surface, e.g., multiple optical, electron or particle beams modulated in parallel. The scanning and repeated reading or writing creates a dense pixel or spot grid on the workpiece. The grid may be created by various arrays: arrays of light sources, e.g., laser or LED arrays, by lenslet arrays where each lenslet has its own modulator, by aperture plates for particle beams, or arrays of near-field emitters or mechanical probes. For reading systems, the point grid may be created by a sparse point matrix illumination and/or a detector array where each detector element sees only one isolated spot. The idea behind the use of large arrays is to improve throughput. However, the throughput does not scale with the array size, since above a certain size of arrays, previously known schemes fall into their own tracks and start repeating the same data over and over again. This application discloses methods to scan workpieces with large arrays while preserving the scaling of throughput proportional to array size, even for very large arrays, in fact, essentially without limits. Other advantages of the disclosed methods are greater flexibility in the choice of array size, workpiece grid, and stage parameters, and a dissolution of hardware signatures in the image, leading to a more ideal image in certain respects than with prior art.

Reading and writing of images can be done in a number of different architectures, e.g., multibeam raster scanning, assembly from small image elements, etc. In this disclosure we will only discuss one particular architecture: scanning the workpiece with sparse point arrays or matrices. This architecture is more and more important due to the increasing capability of microelectronic, photonics and MEMS technology, and the growing availability of large arrays of light and particle sources, modulators, near-field probes and detector elements. Currently, commercially available MEMS arrays may modulate more than 2 million light beams in parallel, at frame rates of more than 20 kHz. Likewise, large detector arrays have long existed as camera chips, and the size and speed is constantly being improved. The continued development of microelectronics, photonics and MEMS technology is likely to make large arrays of other types of elements available, such as near-field and mechanical probes, capacitive or Kelvin probes, magnetometers, lasers, LEDs, and LCD and electrooptic modulators. Arrays of charged particle blankers or massively parallel modulators for particle beams have been demonstrated by several groups. Electron beams also might be used.

The rationale behind large arrays with millions of elements is to get high throughput, but a closer study shows that it is difficult to use these massive arrays efficiently. The designer has to take into account issues of total field size, stage speed and overhead, and the limitations of frame rate in the modulator/detector and the light source. The result has so far not made full use of the inherent speed of the large devices already available.

FIG. 1a shows an example of a generic reading/writing system using a scanning sparse point array as known in the art. The following explanation uses a writing system as an example, and an alternative image-reading system may be extrapolated by the substitution of a detector array for the light source array.

The image-writing system in FIG. 1a creates an image 100 on a substrate 101 by a scanning motion 102 of the image of a point array 103. The point array has a sparse matrix or array of light source elements 104, e.g., VCSEL laser diodes, and each element is projected by means of some optics 106 onto the substrate to form image spots 105. The light source elements 104 are controlled (i.e., turned on or off) by a data path 108, according to an input description (not shown) of the pattern to be produced 100. The data path synchronizes the driving signals 107 sent to the source array 104 to the movement 102 of the substrate as measured by a position sensor 109.

In the example of FIG. 1, the stage is scanning with continuous motion and the light source array prints during a time short enough to freeze the motion and make an image of the turned-on light sources. Since the source array is sparse, the first image is not the desired pattern, but only an array of isolated dots. After the stage has moved a distance, a second dot pattern is exposed and so on. After a number of translations the desired pattern has been completely filled in 100.

Many modifications may be, or have been, contemplated: the projection lenses drawn in FIG. 1 may be replaced or supplemented with one or more lens arrays with one lens per spot. Or the distance between the sources and the substrate may be so short that no projection system is needed to form a spot on the substrate for each spot on the source array.

The light source array may be a modulator array illuminated by a light source, and the modulators may be binary (on/off) or analog (many values, "gray scale"). The light may be visible, infrared, ultraviolet, deep ultraviolet, vacuum ultraviolet, extreme ultraviolet or even x-ray.

The same scheme is also useful for particle beams, e.g., using electrons, protons, ions or neutral atoms. The source array may then be an array of field or photoelectric emitters, or it may be an array of blankers (a so called aperture plate) illuminated from the back side, or it may be a reflection modulator for particles based on voltage contrast (e.g., similar to the modulator used by KLA-Tencor in the REBL, cf. U.S. Pat. No. 6,870,172 B1). For particles, the projection system may be electron optical lenses, either with a lens common to many points or with one lens per point in a lens array, a longitudinal magnetic field, or, again, in such close proximity that a projection system may not be needed at all.

A third possibility is that the source point array is an array of near-field probes, e.g., making a mechanical imprint, exposing by injection or extraction of electric charge to/from the surface, or measuring a property of the surface, e.g., the electrostatic potential or the magnetic field at the surface. An array of near-field optical probes based on field-concentration, plasmons and/or evanescent waves is another example of a possible source/detector point array.

The writing head (with the source array and/or the projection optics), or the substrate, or both may be physically moving to create a relative motion, or the image of the source array may be scanned by the optical means, e.g., by a galvanometer or polygon. With either light or particle optics the relative motion of the substrate can be continuous and frozen by a short exposure time, by stepping the substrate motion, and/or by letting the beams track the continuous substrate motion over a finite distance. In either case, the exposure of different spots may be simultaneous or they may be distributed in time, in which case the effect of timing and movement on the placement of the spots on the substrate has to be accounted for.

Different schemes to fill an area with images of isolated spots can be found in the prior art. The most obvious one is to use several rows of sources across the scanning direction and stagger the elements as is known in numerous patents, see FIGS. 1b-g. In the case of a light source and a modulator per element in the array, the light source may be continuous, e.g., a continuous laser or a laser that emits pulses close enough to be considered continuous. The stage is scanned with a low enough speed to let a modulator change state once per pixel in the grid on the workpiece. In recent patents by IMS Nanofabrication (U.S. Pat. No. 7,084,411 B2 and others) additional rows are added to provide redundancy for bad elements in the array. More elements are added in the same column and small-range scanning is used to let an element write only some pixels in the column on the workpiece to circumvent the speed limitation imposed by the highest practical switching speed of the modulator elements, here blankers in a massively parallel particle beam writer.

Related art is displayed in FIGS. 1b-g: Mark Davidson proposed in a paper in 1996 (Proc. SPIE, Vol. 3048, pp. 346-355) to rotate the array slightly so that each row in a 2D array traces a separate column. The light source was again continuous and the pixels were defined by switching the state of the modulators.

Kenneth Johnsson described a system (U.S. Pat. No. 6,133, 986), FIG. 1c, with slanted spots in 1996, as did Ted Whitney several years before, FIG. 1b (U.S. Pat. No. RE 33,931).

DNS has taken the scheme of Davidson one step further, as shown in FIG. 1d (U.S. Pat. No. 6,903,798).

In an invention intended to write on thermal resist, Gilad Almogy, of Applied Materials, has used a simple 2D interlace scheme in order to put every pixel non-adjacent to the last one, thereby avoiding the effect of heating of adjacent pixels, FIG. 1e (RE Pat. No. 6,897,941).

Ball Semiconductors gave the mathematics of the slanted scheme in 2004 (US2004/0004699), and ASML discussed using hexagonal grids in U.S. Pat. No. 7,230,677 (FIG. 1g).

SUMMARY OF THE INVENTION

The technology disclosed relates to writing or reading a pattern on a surface, such as in microlithography or inspection of mircrolithographic patterns. In particular, Applicant discloses systems recording or reading images by scanning sparse 2D point arrays or grids across the surface, e.g., multiple optical, electron or particle beams modulated in parallel. The scanning and repeated reading or writing creates a dense pixel or spot grid on the workpiece. The grid may be created by various arrays: arrays of light sources, e.g., laser or LED arrays, by lenslet arrays where each lenslet has its own modulator, by aperture plates for particle beams, or arrays of near-field emitters or mechanical probes. For reading systems, the point grid may be created by a sparse point matrix illumination and/or a detector array where each detector element sees only one spot. The idea behind the use of large arrays is to improve throughput. However, the throughput does not scale with the array size, since above a certain size of arrays, previously known schemes fall into their own tracks and start repeating the same data over and over again. This application discloses methods to scan workpieces with large arrays while preserving the scaling of throughput proportional to array size, even for very large arrays, in fact essentially without limits. This is done by first determining a necessary density of grid points in the read or written image, then finding the longest travel per laser pulse, or similar, which produces this density of points when the array traverses the workpiece. The Applicant has found that by rotation of the array vs. the direction of travel and minor adjustment of the distance between laser pulses, it is possible to find a combination of angle and distance which creates the desired density while using all or almost all of the elements in the array, and has devised methods to find such combinations. Furthermore there are several combinations using essentially the full capacity of the array, and these combination may have different properties in terms of grid orientation, uniformity and suppression of systematic errors.

BRIEF DESCRIPTION OF THE DRAWINGS

FIGS. 1b-g show other art of potential interest.

FIGS. 4a-b show how the order of writing the points in one unit cell can be changed and how the translation between each partial image can be tailored to the size and speed of the modulator array.

FIGS. 9a-f show how the image in a small neighborhood on the workpiece is built up from spots corresponding to points that are widely distributed in the array and embodiments of the technology disclosed using multipass writing.

FIGS. 10a-f show rasterization for a binary writing array.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Figure 1A:
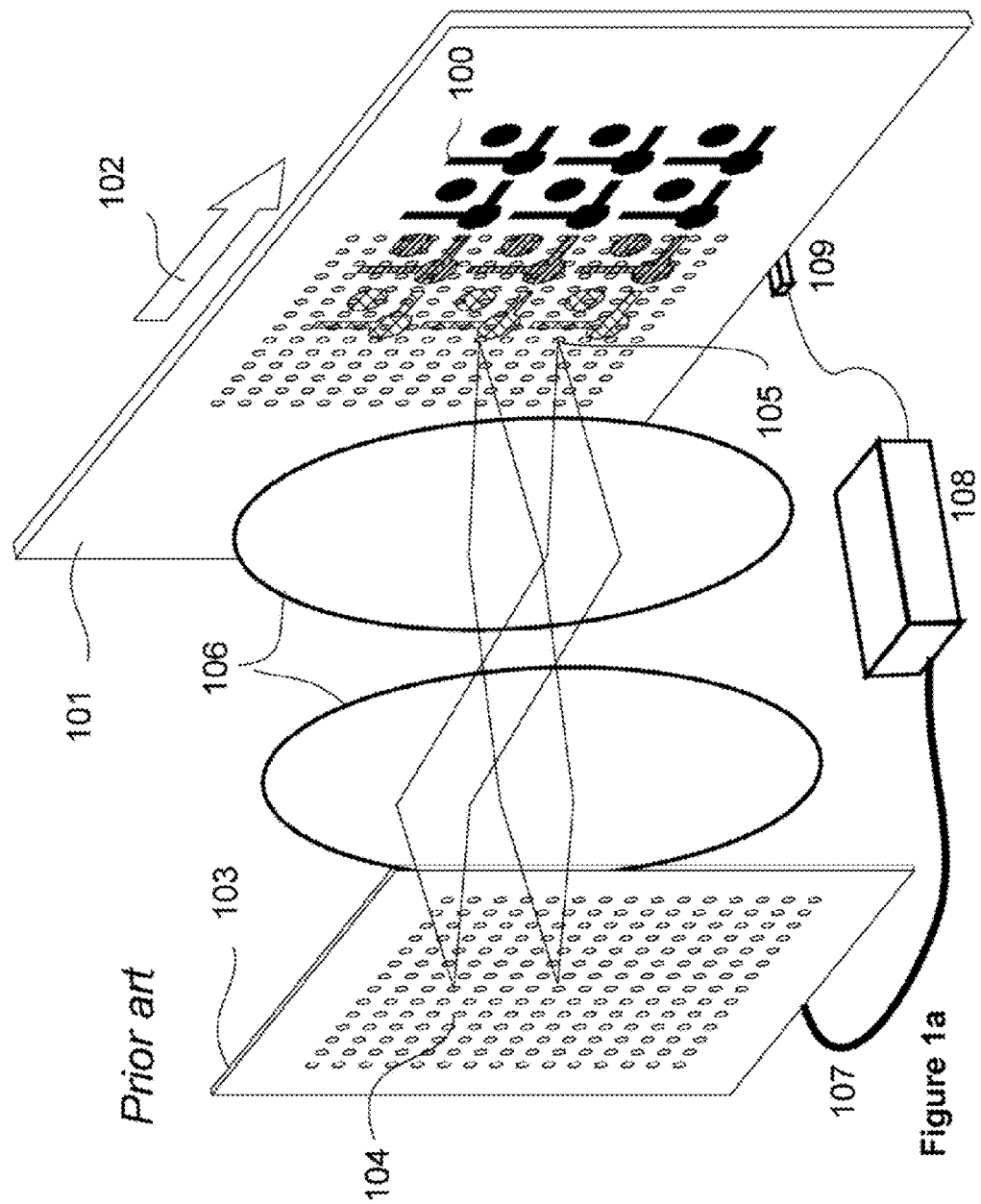
FIG. 1a shows a generic system for writing or reading a pattern using a scanning sparse point array as known in the art.
Figure 1B:
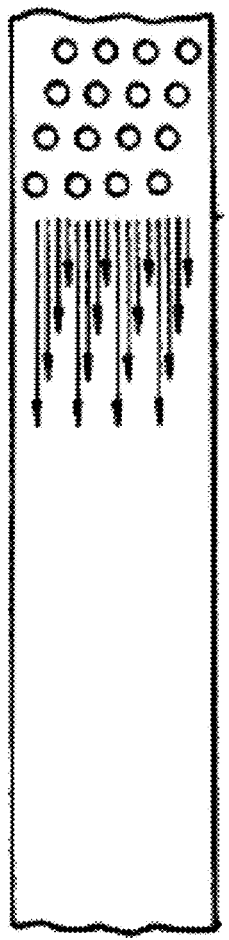
Figure 1C:
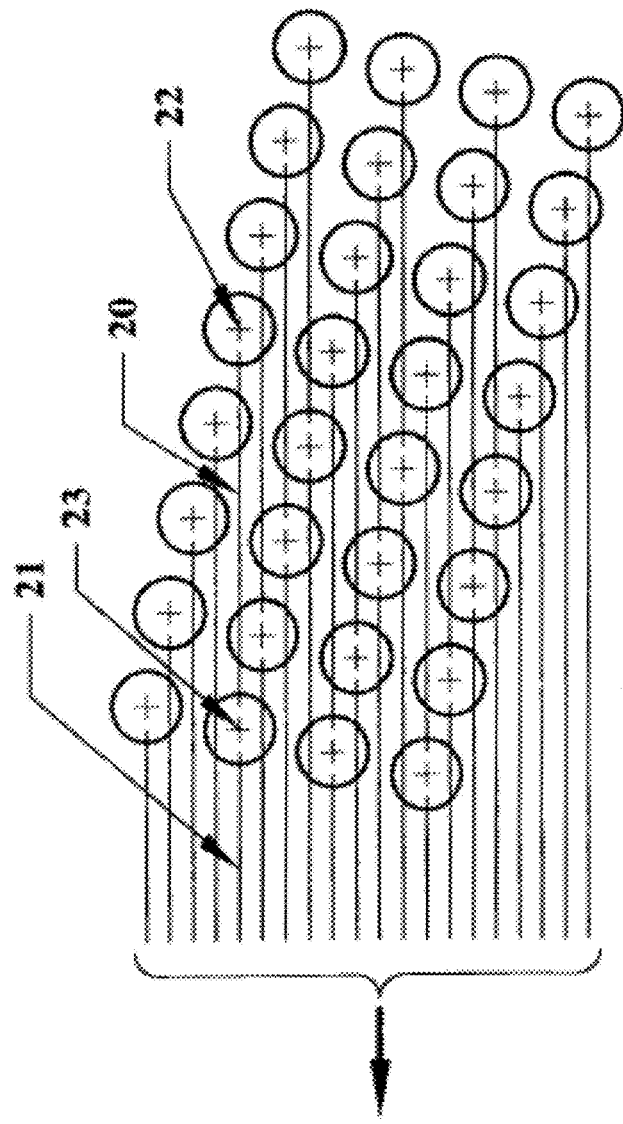
Figure 1E:
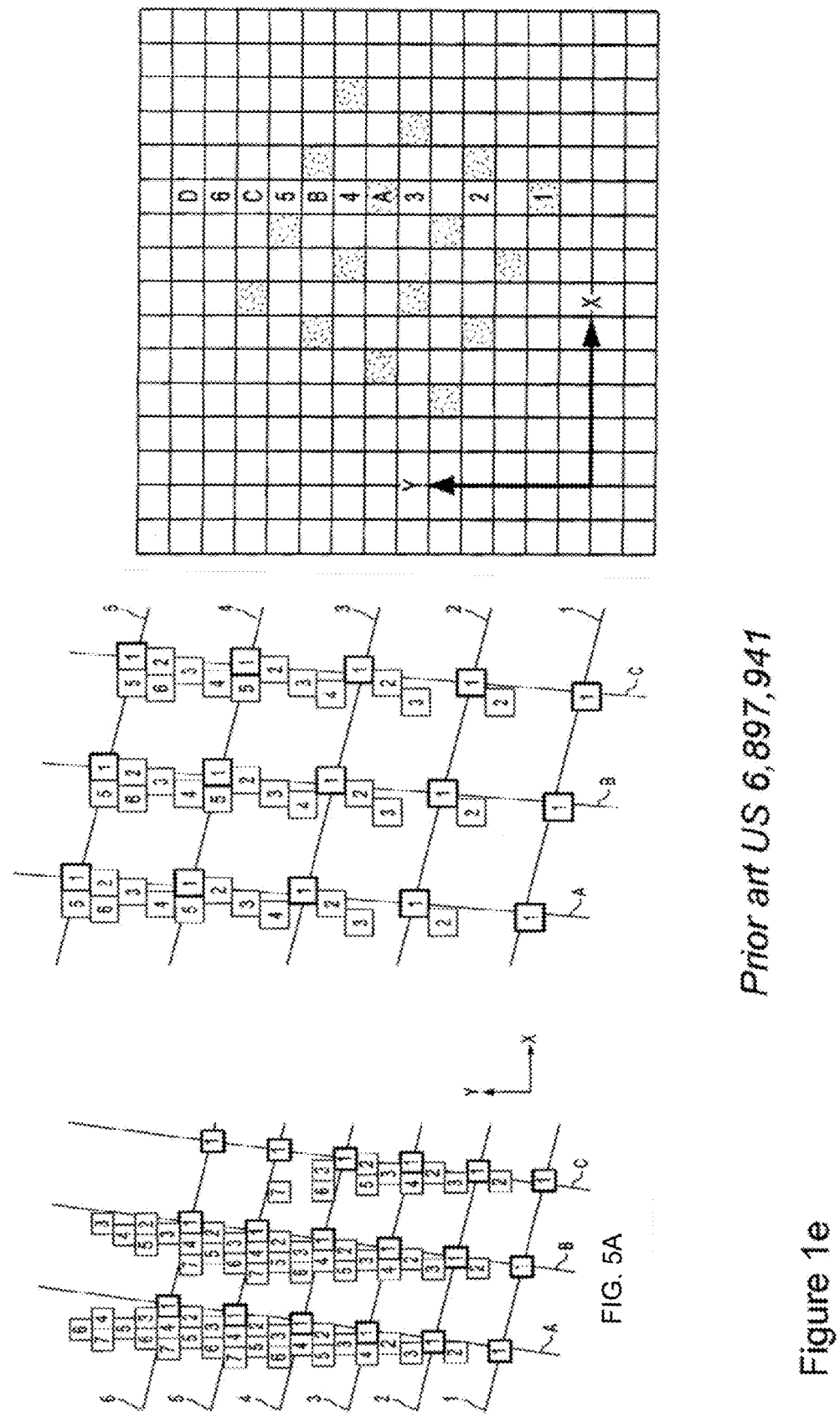
Figure 1G:
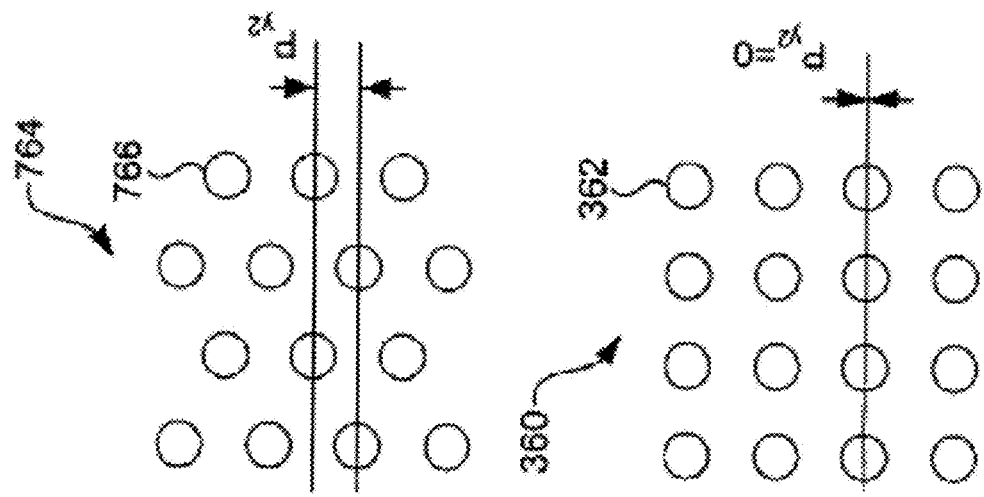
Figure 1G:
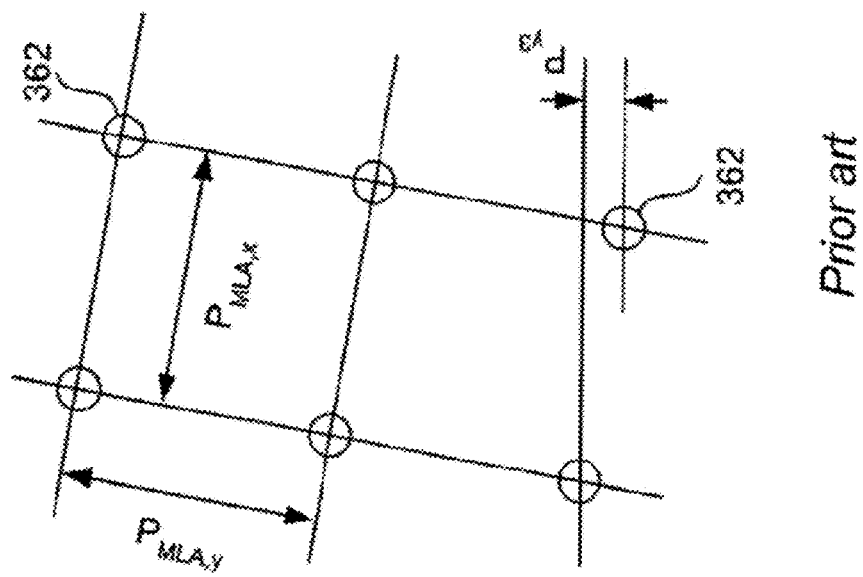
Figure 2A:
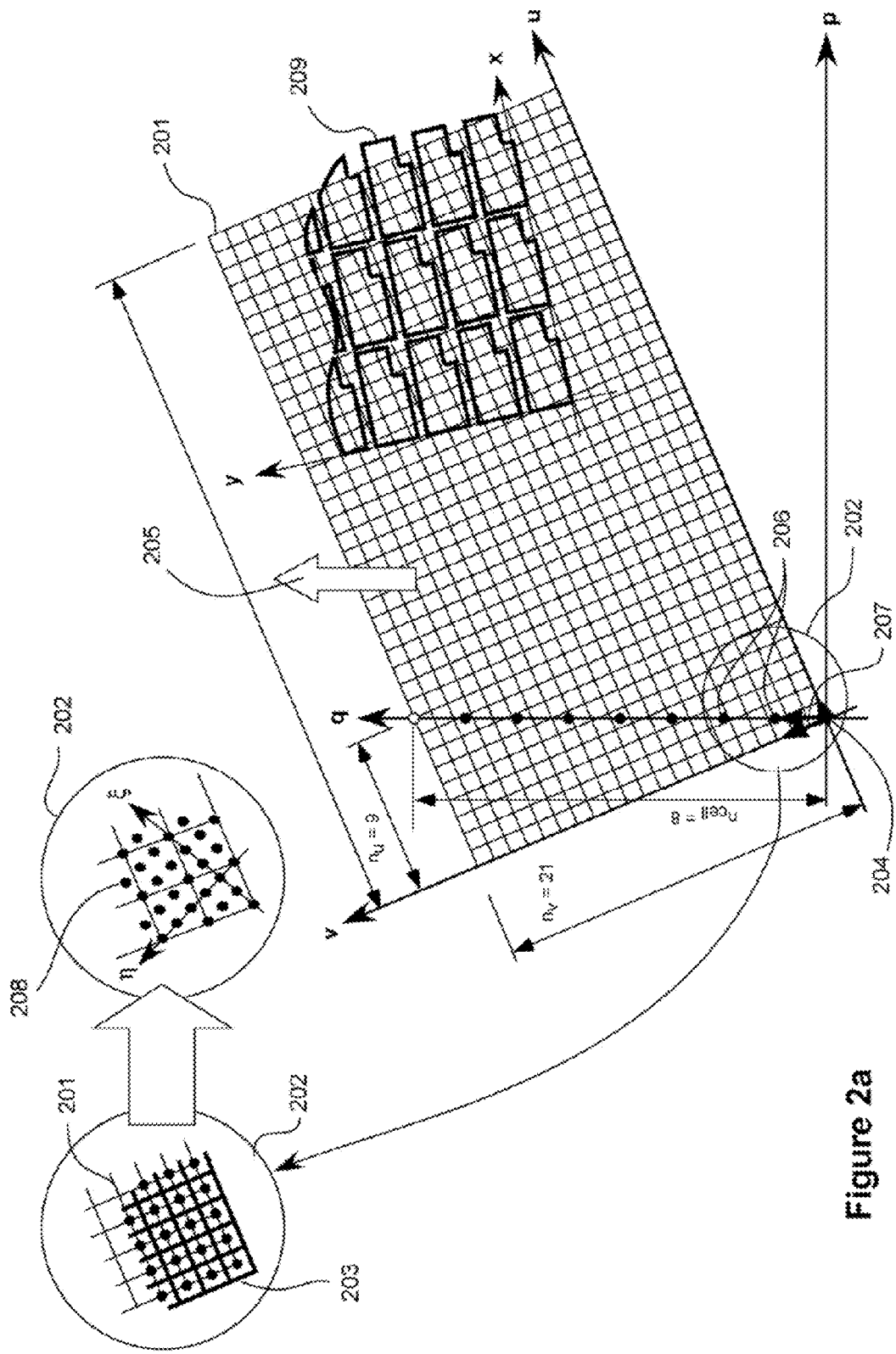
FIGS. 2a-c show a point array with relevant coordinate systems, translation vectors, and lattice vectors as used in the text.
Figure 2C:
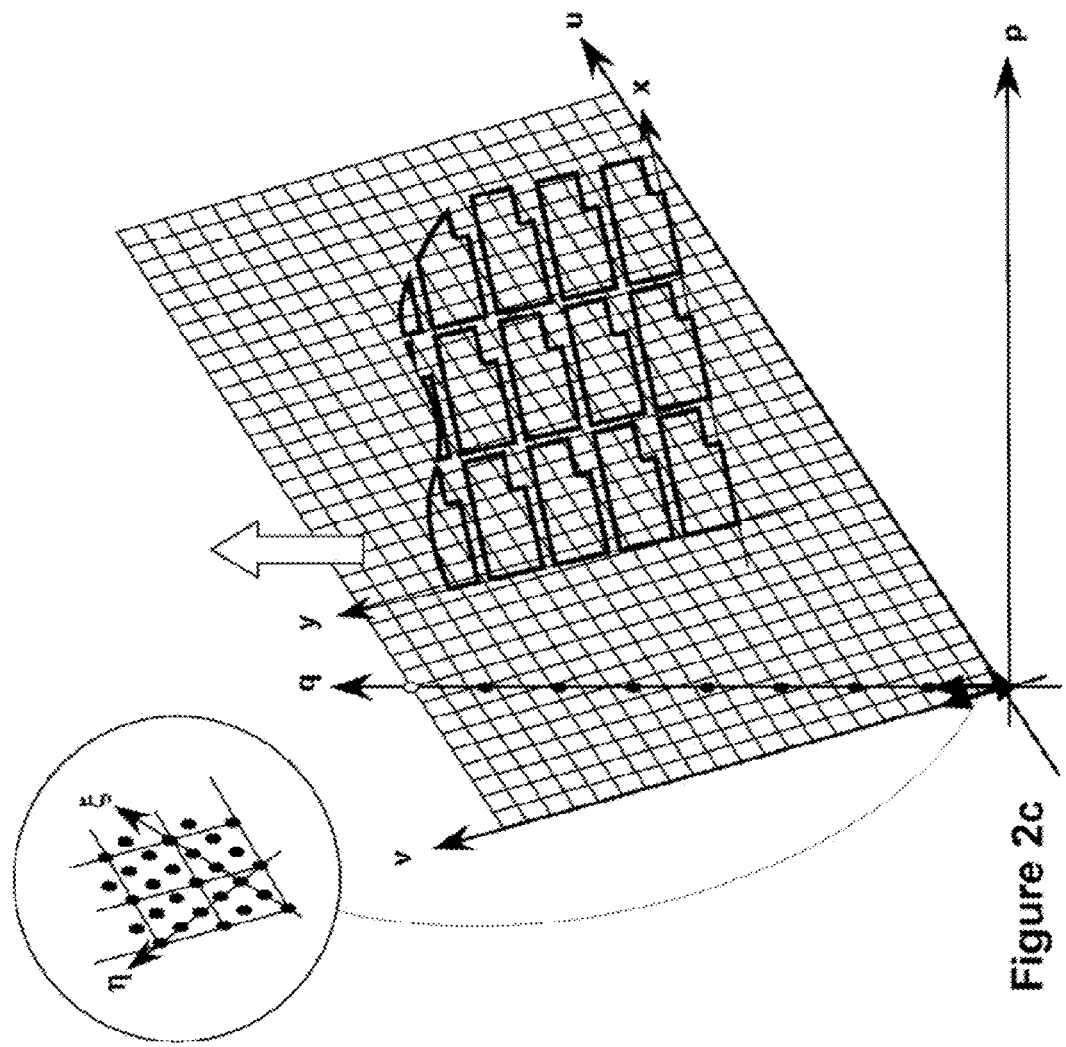
Figure 2B:
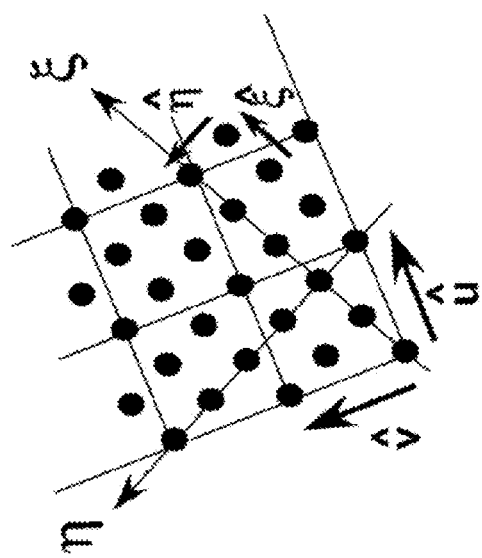

FIG. 2 discloses useful coordinate systems. The main figure in FIG. 2a shows a grid 201, which represents an array of sources, modulators, detectors or probes—a 2D point array. We may borrow terminology from crystallography to describe the regular grids, calling them "lattices," consisting of cells and repeating according to their lattice vectors. Every two-dimensional regular grid can be described as one of five basic types, the 2D Bravais lattices: square, rectangular, centered rectangular, hexagonal and oblique. Each lattice can be described by two basis vectors, the lattice vectors. In the general case, one can choose more than one set of lattice vectors to describe the same grid of points. The following description will use one set of lattice vectors, but an equivalent description based on a different set would be equally relevant.

One unit of the array will be called a cell. The array shown is Cartesian and has cells defined by two perpendicular lattice vectors of the same length, û and v̂. This is common, but not a necessary condition. FIG. 2c shows the same figure with the same interlace parameters for an oblique point array. The topology stays the same, but the grids are oblique or skewed and the rasterization of the object will be different. From comparison of FIGS. 2a and 2c, one can see that a variety of array shapes can be used with the methods and devices disclosed. In addition to rectangular arrays, the method disclosed can be extrapolated to oblique arrays. Since any 2D lattice can be expressed as a special case of an oblique lattice, we can apply the principles disclosed to any array shape.

The array in FIG. 2a is larger in both directions. What large means may be relative, but it is larger than 100 cells, preferably larger than 300 and definitely more than 30 cells along the shorter axis. Typical sizes in many applications may be approximately 640×480, 1024×768, 1344×768, 1920×1080, or approximately 4000×2000. The axes of the array are denoted by the letters u and v.

Figure 14:
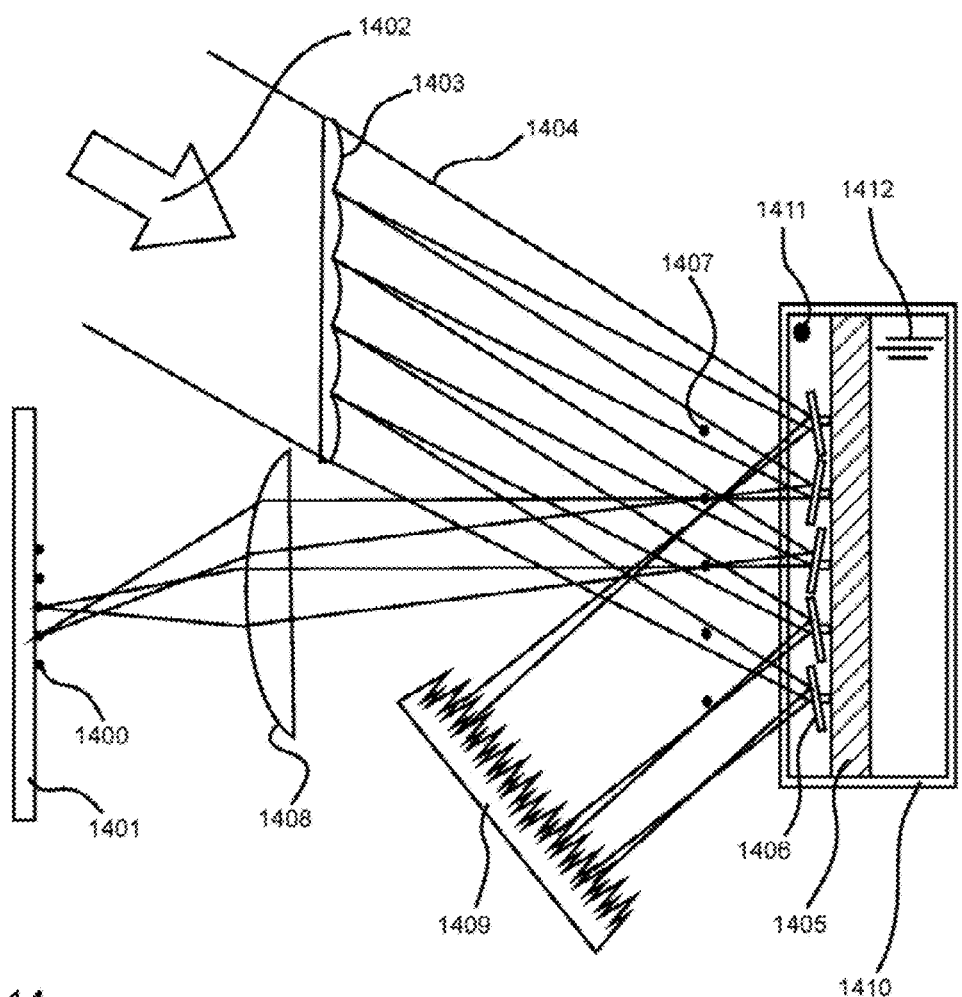
FIG. 14 shows in schematic for elements of a high-power preferred embodiment using high power laser light.

The inset shows a corner 202 of the array, and it shows the underlying hardware, e.g., a micromirror array 203 illuminated by a spot of light at the center of each mirror (see further FIG. 14 and the discussion of it). The spot of light coincides with the crossing of the lines in the array 201. The spots are projected or otherwise transferred to the workpiece and can be modulated by each micromirror controlled by a datapath. At a specific moment in time, all spots that are turned on print to the workpiece (alternatively, in a reading system, light or equivalent energy fall on the array of detectors or probes and can later be read out and analyzed). The result is a sampled image with isolated spots, e.g., the corner spot 204 forms one element in the image. We may call the image formed by the array in a single position a partial image.

The array (or the image of it) is then translated 205 relative to the workpiece, e.g., by mechanical or optical scanning, and a new translated partial image is formed. The corner cell is then forming a new image element 206 displaced by a vector 207. The translation vector may be tilted versus the axes of the array lattice vectors û and v̂. We may call the direction of translation q and the direction perpendicular to it p. The angle between y and q may be approximately 30 degrees, but, as will be shown later, there is large freedom to choose between p and q. Typically, in a writing system p and q are the movement axes of the mechanical system, and may be called stepping and scanning directions in a flatbed stage.

The array is repeatedly translated by the same vector 207 and partial images are formed. Provided conditions that will be outlined below the partial images will gradually fill in the pattern of a uniform grid pattern 208 shown in the inset. The grid 208 is different from the grid of the array, and each cell of the array contains $N_{cell}$ grid points of the workpiece grid 208. In the inset $N_{cell}$=5 (four grid points inside each cell and four times one quarter grid point at the corners). The workpiece grid is regular and repeats along two axes xi and eta. The workpiece grid axes may or may not coincide with any of the other axes and the grid may be square, rectangular, or skew, parallel or rotated to the stage or array. There is great freedom in creating a grid with desired the properties (e.g., density and distribution of spots) by changing the vector 207.

For clarity, the inset shows only five grid points per cell, but the main figure shows conditions for creating eight points per cell. The corner spot prints the first spot at the corner between four cells, and being repeatedly translated and printed, it prints seven unique positions (black dots 206) relative to the cells until it again prints a spot at the corner between four cells (white spot). The white spot is shown as belonging to the array for reasons of clarity. In reality, the row containing the white spot is not printed, and neither is the row above it. If the array is chosen one cell smaller in v than where the white spot occurs, it will not be printed and every point in the array prints exactly eight spots before the array has passed the position on the workpiece.

The spots printed by the corner spot are distributed in a line on the workpiece and so are the spots printed by every point in the array. It is easy to convince oneself that there are eight times as many spots as there are points in the array and they are all at unique positions. Therefore, every cell is filled with eight spots and the entire area is filled with a regular pattern of printed spots. In a writer, the spots in the array are on, off or a state in between depending on the position of each printed spot relative to the desired pattern 209. The workpiece coordinate system is x, y to make it transparent to the user. In a properly designed system, an operator of the machine may never have any reason to use p, q, u, v, xi or eta, or even be aware of their existence.

What is the condition that a surface-filling grid pattern is printed with only one partial image (or alternatively a predetermined number of partial images) on each spot? Printing every grid point once and only once gives the theoretically maximum throughput to the system. A condition for eight spots per cell is given in FIG. 2: The direction of the vector 207 is given by the number of cells in the u and v directions before the first repeated point is reached, i.e., $n_u$=9 and $n_v$=21. The length is made such that nine vectors reach the first repeated point, i.e., there are eight non-repeated points or $n_{cell}$=8. These three integers $n_u$, $n_v$ and $n_{cell}$ control the creation of the workpiece grid. Coordination between $n_v$ and the size of the array in the v direction determine that every spot position is printed once and only once, or alternatively another integer times.

Figure 3B:
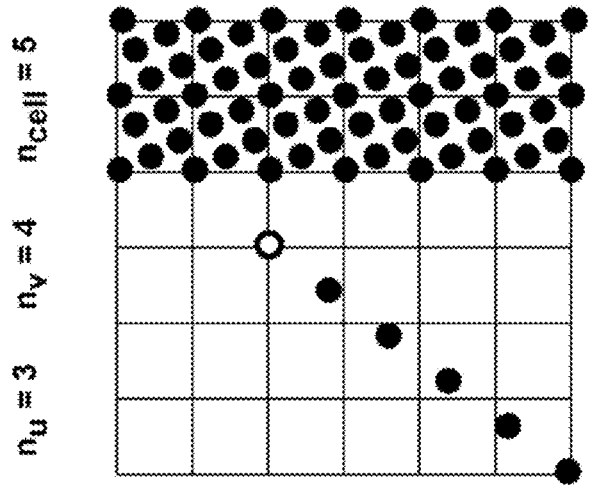
FIGS. 3a-b show two examples of two-dimensional interlace grids creating different grids.
Figure 3A:
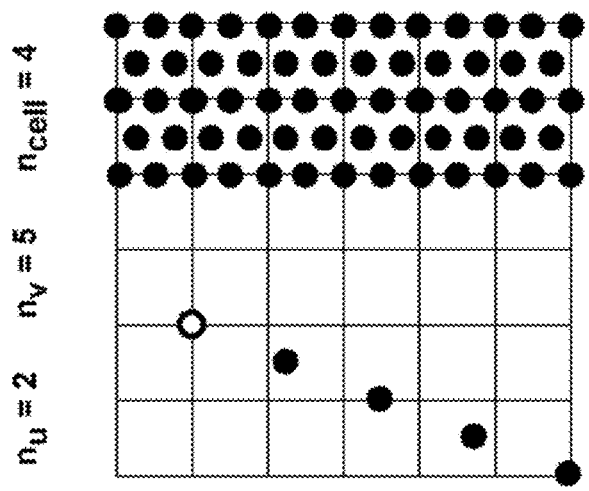

FIG. 3 shows how different grids are created by different sets of integers. One set of integers (2, 5, 4) makes the grid approximately hexagonal, FIG. 3a, while another set (3, 4, 5) makes it seemingly square but rotated relative to the array, FIG. 3b. Note that the upper part of the arrays from the white spot upwards, are not used. Therefore, the parameters (2, 5, 4), FIG. 3a, print more spots per second than (3, 4, 5). It is a thus a feature of the invention that the translation vector is parallel to a line between one point at the first row and another point at a row which would be printed if the array was one unit deeper.

The integers used in FIG. 3 are chosen for illustrative purposes and in real applications these integers may be much larger. A typical array may be 1024×768, 1920×1080, or 4096×2048 points instead of the 7 cells high array shown in FIG. 3. How can one choose the integers in order to get the most efficiency from a given very large array? FIG. 4 shows in greater detail how the integers can be chosen and the freedom that exists for using the area of a large array in an optimal way.

FIG. 4a shows how the same modulator (detector, etc.) element 401 is translated and prints spots along a line 404. First, the modulator 401 prints a spot which belongs to the lower left cell (cell (1, 1)). Then it translates to the position 403 and prints a second spot in cell (2, 3), and, after one more translation, it prints a spot in cell (3, 6). The spots printed by one modulator (or read by one detector), thus, belong to different cells.

But, while the modulator 401 moves from the first printing cell to the next printing cell (i.e., from (1, 1) to (2, 3)), another modulator (not shown) moves to the first printing cell and prints a second spot there (i.e., from (0, −2) to (1, 1). For each translation of cell 401, a new cell moves into the first printing cell and prints a new spot there. Therefore, each spot in the first printing cell (1,1,) is printed by a different modulator, and the number of spots in cell (1,1) becomes the same as the number of translations before the entire array has passed cell (1,1), i.e., $n_{cell}$.

All the spots in one cell are printed by different elements, but we may consider all modulators (sources, detectors, probes, etc.) to be identical and exchangeable. Therefore, one might imagine that a single modulator is moving around inside the same cell and printing all the dots there. What governs the movements inside a single cell is the fractional part of the translation, when the translation is expressed in u, and v units. There is also an integer part of the translation (integer cells) that determines which actual element is responsible for a particular spot, but as long as the data channel knows what is happening we may consider this immaterial and change the integer part at will. This can be used to move a printing grid between arrays of different size, or for converting a printing scheme, printing every spot once to the same grid with each spot printed twice. It can also be used to change the direction of translation, e.g., for error cancellation on certain patterns.

The translation vector 402, which is (1.125, 2.75), can be expressed as a small fractional vector 406 (0.125, −0.25) pointing downwards and the integer 407 part (u, v)=(1, 3). We have chosen the fractional part to give spots in the cell to the right and below the starting position, in order to make FIG. 4*b* easier to read. For each partial image, the spot inside the cell moves downward and to the right in a line, until it has accumulated one full cell, and then we arbitrarily remove that cell to bring it back into the cell. Thus, it forms two rows of spots in the cell. This repeats in every cell and forms the grid. The integer part of the translation vector can be changed and the written grid will not change since it is determined by the fractional part of the translation vector. For example, if we have printed all spots in the cell before we have used the entire array the translation vector is too short, and we may increase the length of the translation vector by adding integer cells to u and v. A longer translation vector means that the stage moves faster and scans more area per second, i.e., throughput is higher.

We may also change the order by which the spots are written by multiplying the fractional translation vector by a selected integer value, as explained later. In FIG. 4*b* we have added (u,v)=(1,−1) to the original vector (1.125, 2.75) to get (2.125, 1.75) 410 and multiplied the fractional part by three 409 to get a new translation vector (2.375, 1.25) 411, which writes the same grid as (1.125, 2.75) although in a different order. Since the translation vector is in the direction q, we have changed the rotation angle of the array and at the same time made it move less in v per partial image, thereby printing more partial images for an array of given v size. In this way one can change the grid, the array size and the rotation angle independently. Independent control over these parameters makes it possible to optimize the throughput while keeping other specifications, such as resolution or smallest address. In particular, one may increase the translation vector to use all or almost all of the elements of the array. Assume for example that one wants to have 100 spots per cell ($n_{cell}$=100) and the array is 1920×1080. The fractional part is chosen to be approximately (u, v)=(0.1, 0.3). If (3, 10) is added to the fractional part the translation vector is then (3.1, 10.3) and 100 translations uses 1030 cells in the v direction, i.e., 1030/1080=95% of the area of the array or 95% of the theoretical elements are contributing to the throughput.

When trying to find interlace parameters for optimum or close to optimum throughput (e.g., using more than 30%, 50%, 80% or 90% of the array) and having a desired density and distribution (e.g., isotropic density, rectangular, near hexagonal, etc.), we may use the procedure above or use the size of the array directly as $n_v$. If we can allow oblique grids, there are so many possible combinations of the interlace parameters $n_u$, $n_v$, and $n_{cell}$ that we can right away select $n_v$ as the largest integer that fits the array size and try to find $n_{cell}$ and $n_u$, which give the desired grid.

The graphs in FIG. 5 show how the grid is influenced by the choice of integer parameters. The graphs show only the fractional part, i.e., the location of all spots area reduced to one array cell by addition or subtraction of unspecified integers. The graphs are made by a simple Excel program that calculates the translation vector from the parameters, move the same point a large number of times and plots the fractional part of the location of the printed spots. As described above, the idea is that every cell will be filled in the same way, but with different mirrors for each spot. Calculating the fractional part of the movement is the same as finding the elements that will print in one cell and plot where they print. The graphs plot all plotted spots in the cell with round markers, then overlays a trace with the first 14 spots marked with squares. This gives an indication of the order in which the spots are printed. Later we will discuss how a local environment consists of spots from different areas of the array. One element of the distribution of points on the array is determined by the order of printing and a more random order of printing gives more distributed points getting printed in the local neighborhood.

Figure 5C:
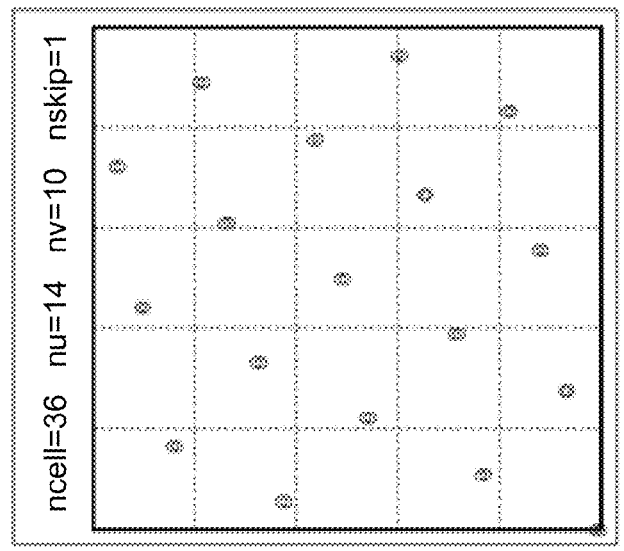
FIGS. 5a-c show how the spots in the unit cells can be changed by the interlace parameters and how the points can be written a variable number of times.
Figure 5B:
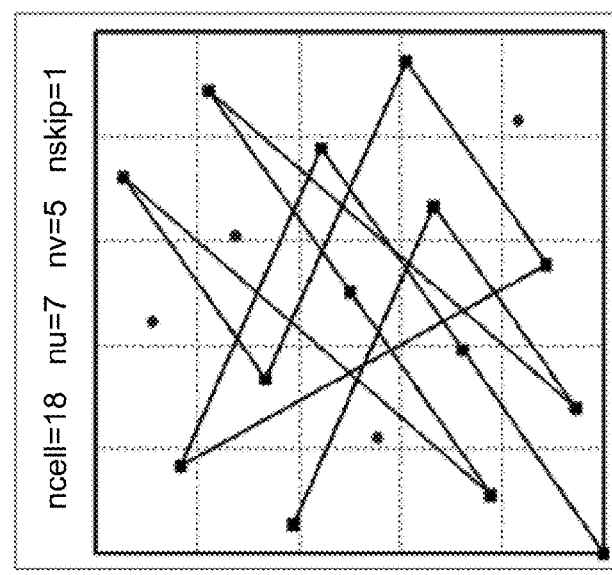
Figure 5A:
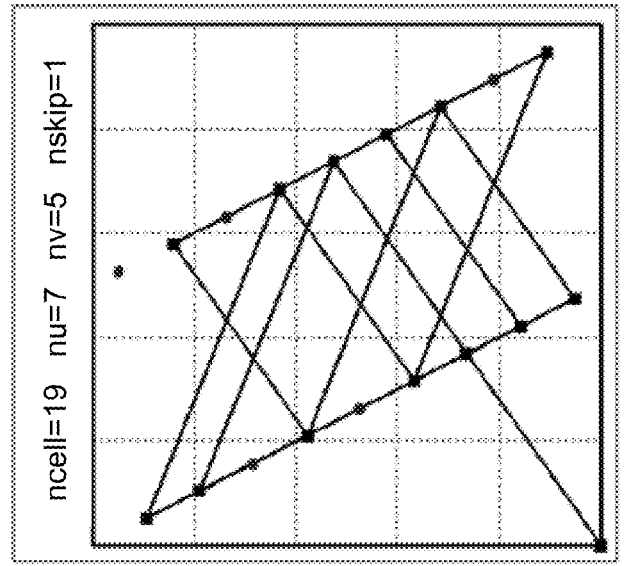

In FIG. 5*a*, with the parameters ($n_u$, $n_v$, $n_{cell}$)=(7, 5, 19), the printed spots are not uniformly distributed within the cell and the grid is unsuitable for printing with directionally isotropic properties. The distribution is not isotropic, and the resolution will be better in the direction where the spots are closely spaced and worse across it. Changing one parameter with one unit to (7, 5, 18) produces a reasonably even distribution of points, as shown in FIG. 5*b*. The grid is oblique or nearly hexagonal. In an oblique grid, there are often different ways to choose the axes xi and eta, and this grid can be described as a number of oblique grids, or as a distorted hexagonal one. An interesting property of FIG. 5*b* is that the spots are printed in a seemingly haphazard way, that is, the sequence in which the spots are printed is a non-trivial consequence of the parameters chosen. The result is that some systematic errors that depend on the sequence of plotting are concealed and converted to an apparent noise. The disclosed writing strategies may conceal signatures of the hardware on several levels.

FIG. 5*c*, finally, with the parameters (14, 10, 36), shows how one can convert the pattern in FIG. 5*b* to be plotted twice. The points are identical to FIG. 5*b*, but each point is double (slightly displaced in the plot to show that it has been plotted twice. The reason why every point is plotted identical but twice is that 2 is a common denominator in all three parameters. Having each point printed twice may be useful for redundancy, or for building a higher exposure dose if the dose is limited per partial image. Plotting the same spots twice, or any other integer number of times, makes it possible to create crude gray scaling by turning some spots off, other spots on the maximum times, and some spots on an intermediate number of times, e.g., once with a repeat factor of two.

Figure 6A:
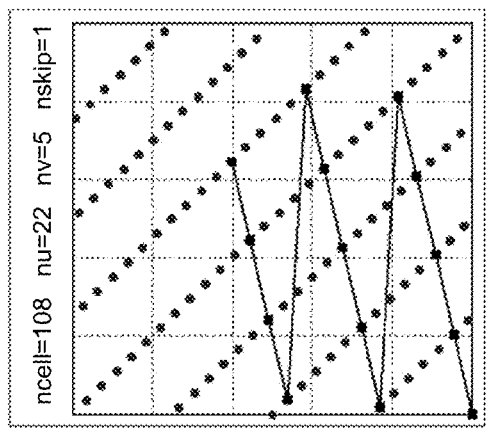
FIGS. 6a-d show how small changes in the interlace parameters cause large differences in the grid.
Figure 6B:
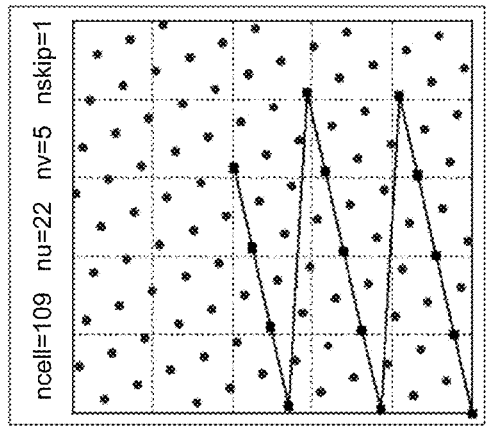

The created workpiece grid is very sensitive to the values of the parameters as shown in FIGS. 6a-d. The four graphs show the same parameters except that $n_{cell}$ varies by one unit from graph to graph, going from 108 to 111. FIG. 6a shows $n_{cell}$=108. The resulting point distribution is not useful for the same reasons as discussed in connection with FIG. 5a; the distribution of spots is not isotropic. Increasing $n_{cell}$ to 109 gives a nearly hexagonal oblique grid. $n_{cell}$=110 gives a rectangular (aspect ration 10:11) grid parallel to the array, and $n_{cell}$=111 gives nearly the same grid rotated.

Figure 6C:
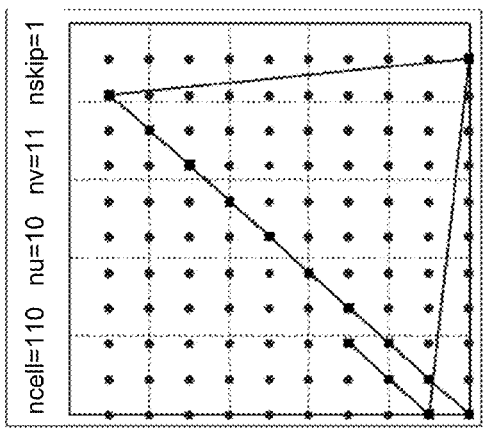
Figure 6D:
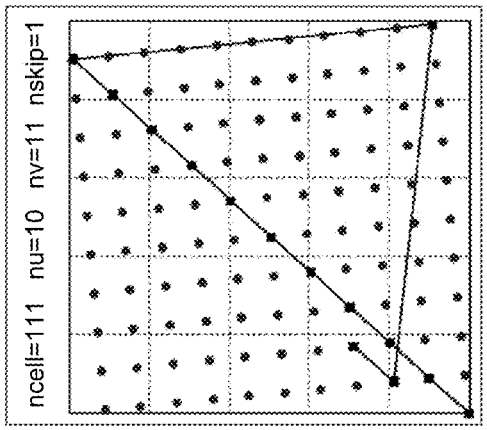
Figure 7B:
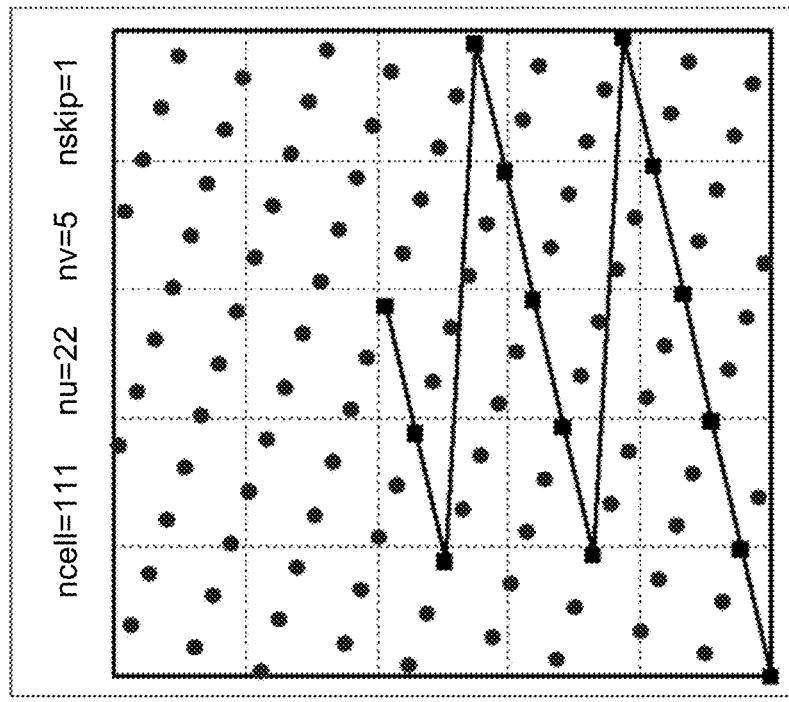
FIGS. 7a-b show how small changes in the interlace parameters cause large differences in the grid.
Figure 7A:
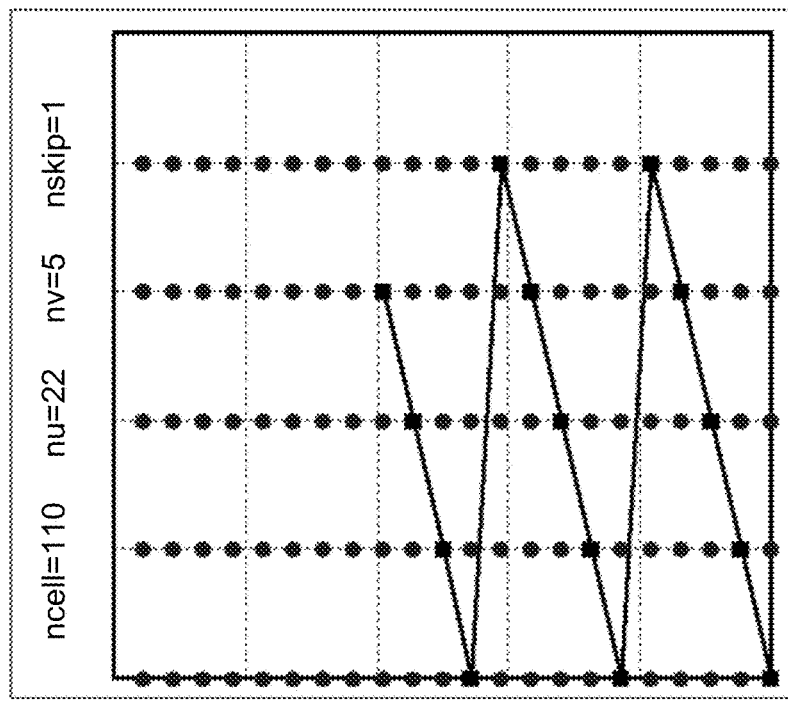

It is not easy to give rules for the choice of parameters. It is known that in one dimension an interlace system which prints each spot once and only once can be described by two numbers which are relative primes (e.g., IMS Nanofabrication patent), but the same rules seems not to apply in two dimensions. For example, the parameters in FIG. 6c are not relative primes to each other.

A few rules are known:

Rule 1. $n_{cell}=n_u*n_v$ ($n_u$ not equal to $n_v$) gives a rectangular grid with aspect ration $n_u:n_v$ and parallel to the array.

Rule 2. $n_{cell}=n_u^2+n_v^2$ gives a square grid, but rotated (FIG. 8a). If $n_u$ and $n_v$ are very large numbers and $n_{cell}$ becomes unreasonably large, a smaller value can be found by changing them to $n_u'=n_u-I*n_{cell}$ and $n_v'=n_v-j*n_{cell}$ with integer I and j.

Rule 3. if $n_u$, $n_v$, $n_{cell}$ have a common denominator k, $n_{cell}/k$ spots are written (or read) per cell and each spot k times. The k spots can be used for crude gray-scaling.

Rule 4. In the graphs there is a fourth parameter $n_{skip}$ corresponding the factor 3 in 409 of FIG. 4b. $n_{cell}$ and $n_{skip}$ may not have any common factor larger than 1 ("relative primes"), or else some spots are not printed and the spots that get printed are printed multiple times.

Figure 8B:
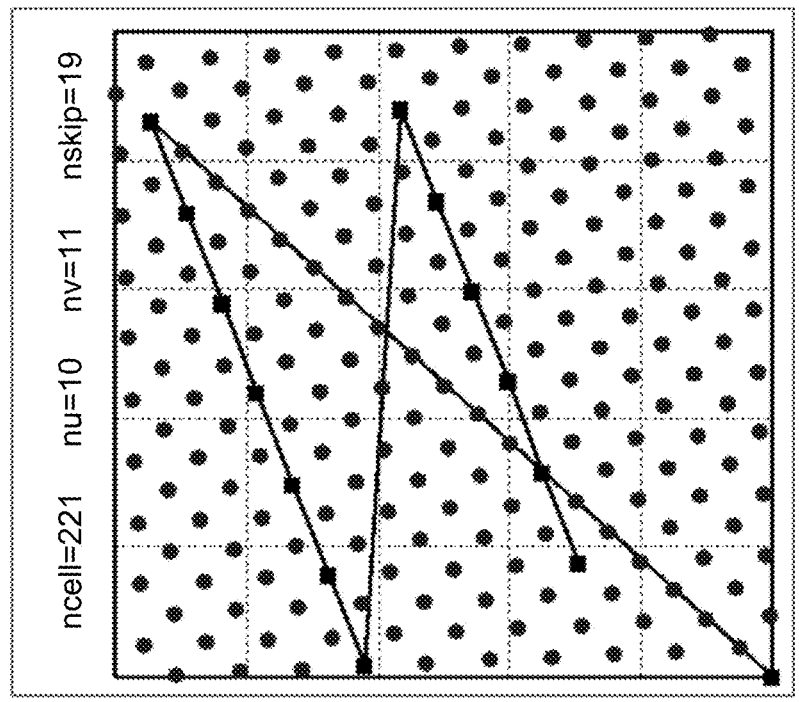
FIGS. 8a-b show an embodiment with a square grid and the function of the parameter $n_{skip}$.
Figure 8A:
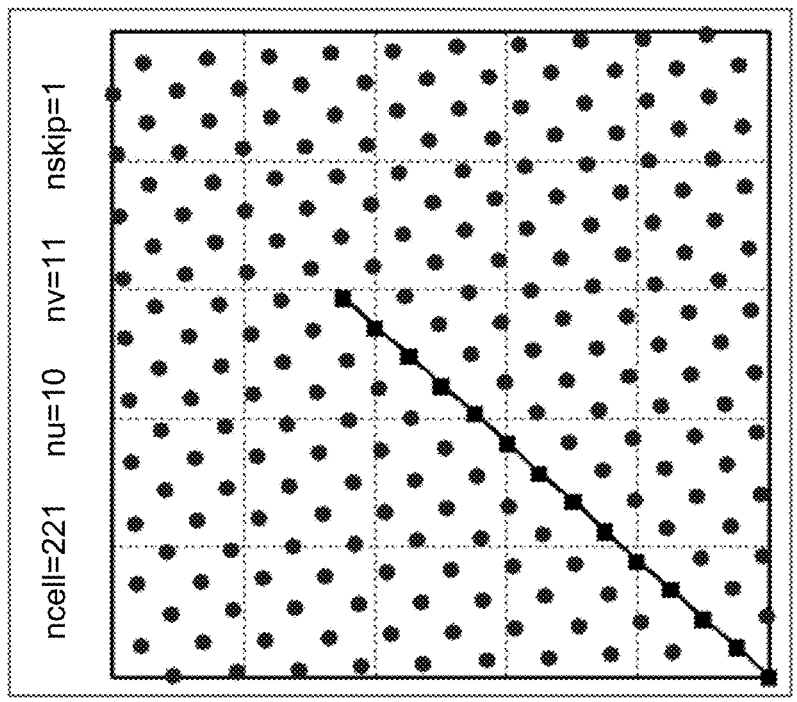

The factor $n_{skip}$ is useful for changing the order in which the spots are written or read as shown in FIG. 8. In FIG. 8a $n_{skip}$=1 and the spots are plotted sequentially. In FIG. 8b $n_{skip}$=19, and, since 19 is relative prime to $n_{cell}$=221, all spots are plotted once and only once, but in a different and more complex order.

Rule 5. The scheme works essentially unchanged for regular arrays with cells of different size, e.g. rectangular, skew, or hexagonal. The workpiece grid has a different shape for the same parameters if the array cell is different and the rules 1 to 5 above are modified, but no new complexity is added.

One of the advantages of the disclosed interlace scheme is the large flexibility to create different grids, use arrays of different size and shape, and to change spot density and stage speed to fit various boundary conditions.

The negative side of this flexibility is the difficulty in understanding how the parameters interact and to predict how the grid will come out in a system with a realistic array size. The simple remedy is a small computer program that accepts the relevant parameters and plots the grid in the cell and across the array. The following is a snippet pseudo code that calculates the grid points in FIG. 8b in the order they are written:

```
Ncell := 221
Nu : = 10
Nv := 11
Nskip := 19
FOR i:= 0 TO Ncell-1
    p := i*Nskip*Nu/Ncell
    q := i*Nskip*Nv/Ncell
    p_frac := fraction( p)
    q_frac := fraction( q)
    Print (i, p, q, p_frac, q_frac)
END FOR
``` where fraction(a) means the remainder when the integer part of a has been removed. The coordinates (p, q) can be plotted in the array and the fractions (p_frac, q_frac) in the cell 0<p<1, 0<q<1 to show the behavior of the particular set of parameters work.

It has now been shown how a suitable grid can be tested using small numbers and how the interlace scheme can be modified to use most of the area of the array while preserving the grid, or alternatively how one can start with the array size and test a suitable grid.

Finding a good set of parameters for a known array with efficient use of the array size may be done in the following way. First a suitable grid is determined based on the specifications for the system or for the job at hand, e.g. resolution and edge roughness. For every job there is a necessary density of the grid which depends on the requirements, the writing scheme, and the cleverness of the algorithms used for rasterizing. Anything denser is unnecessary grid density. Determining necessary grid density, particularly with binary operation and multiple passes, can be a difficult task. The algorithms presented in this disclosure are believed to be efficient in terms of using fewer pixels to print the same pattern.

Determining the necessary grid density is best done by computer simulation of how a representative image is built at different grid densities and using other restrictions which might apply. The current absence or depth of gray-scaling is used, as well as the planned method of rasterization. The rasterized points are convolved with the spot function, e.g. a Gaussian spot with a specific Full-Width Half-Maximum size. Typically the smallest feature to be written determines the FWHM and the edge roughness and linewidth control determine the grid size. For binary pixels a typical relation may be 3-4 pixels per FWHM and 1.5 FWHM per smallest linewidth. For gray-scale pixels the numbers are somewhat smaller. Exact numbers depend on the application.

After the spot size has been determined the size of the focus spots 1407 on (or near) the modulator elements 1406 and the magnification of the projection optics 106 can be set based on power handling and optical aberrations. The pitch of the array is known and the magnification gives the pitch between spots in the image. Array pitch and suitable grid gives grid pints per unit cell $N_{cel}l$ (or N). We now know that the total number of grid points will be N times the number of elements in the array, therefore the array must be printed or read N times when it traverses a point on the workpiece. Assume that there is a good combination of parameters for the full size of the array, (v or "depth"). We would then flash N times for a translation of (depth+1) cells in the v direction. If there is a good combination it can be found by rotating the array so that the translation vector to all angles where the movement direction parallels a line connecting particular spots in the first row of projected spots on the surface and the last row which would be printed if the used part of the array had been one element deeper (containing the white spots in FIGS. 2a, 3a, and 3b). The length of the translation vector is in each case the distance between the two particular points divided by N. Each angle can be analyzed and plotted by a computer program similar to the pseudocode above or equivalent, and the angles can be exhaustively searched. If no good combination is found the depth of the array may be reduced by one unit and the exhaustive search repeated. The analysis may be done manually or automatically.

The described procedure will predictably find every useful sets of parameters, usually a large number if the used depth of the array is allowed to vary by a few percents. More than one set of parameters may be used in the same system. Different sets may have different properties in terms of edge roughness and obfuscation of systematic errors, and may be suitable for different types of patterns and may be used for different workpieces requiring different trade-offs between speed and accuracy. In particular a short distance between each pulse gives a low speed and high accuracy through a dense pixel grid, and a long distance gives high speed, a coarser grid and less accuracy. The system, (machine and/or computer for setting up job parameters) may have software for graphically plotting the printed grid for different sets of interlace parameters and for predicting the resulting speed and accuracy.

Multipass Writing

Figure 9A:
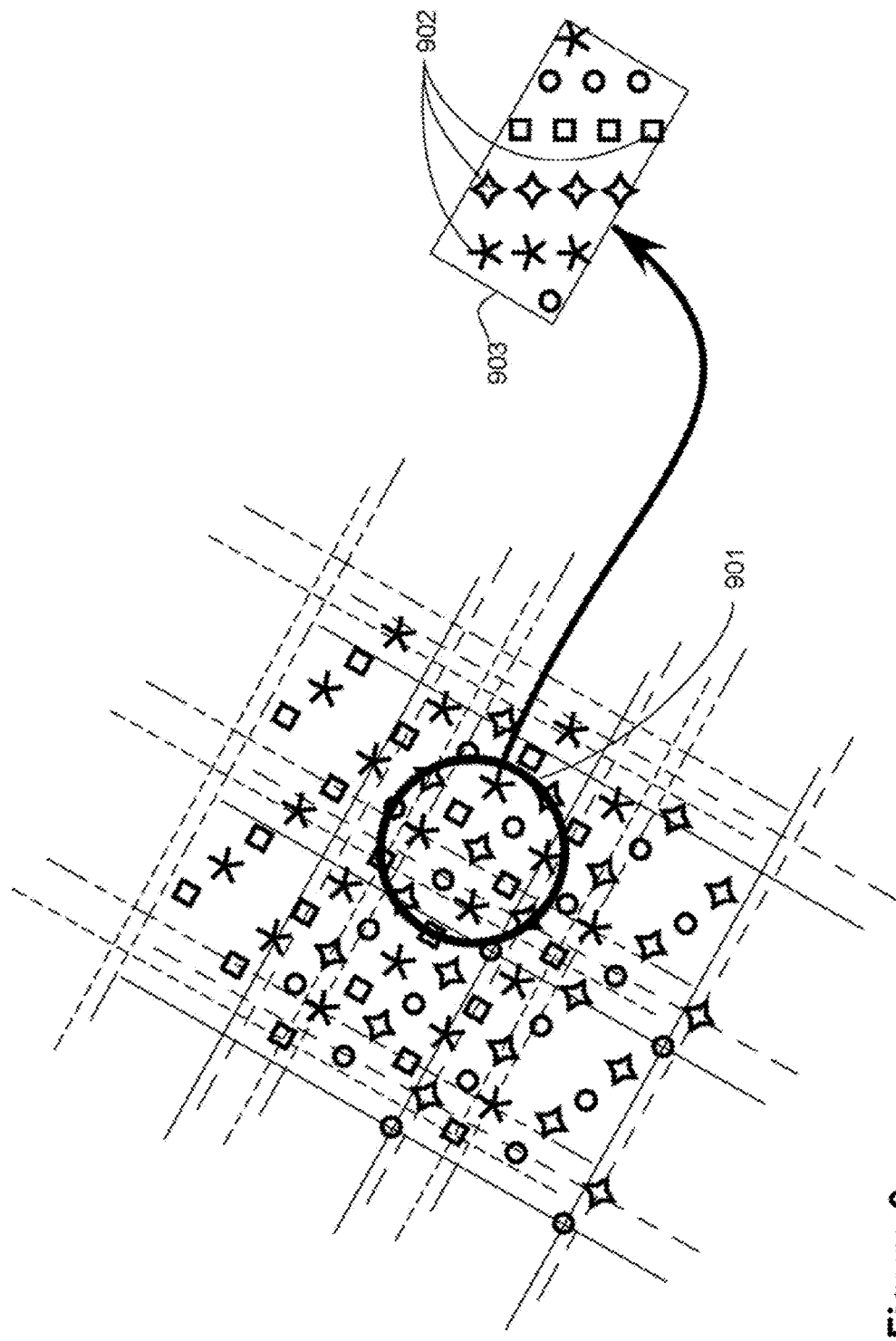

It is well known in the art to read or write multiple passes in order to suppress systematic errors and improve resolution. Multiple passes may be implemented as painting the entire workpiece repeatedly, as running several stripes on top of each other or as having multiple writing heads writing overlapping patterns. FIG. 9 illustrates a combination of interstitial printing or reading of spots in a cell, as disclosed, with multipass writing. For instance, the multipass scheme The 2D interlace scanning, combined with multipass scanning, creates a local environment 901 on the workpiece of spots written/read by modulator/detector elements 902. The array elements that contribute to spots within a particular cell are found at widely distributed parts of the array 903. Within every patch of sixteen adjacent grid points there may be at least two spots which have been modulated by elements at opposite halves of the array in the v direction. There may also be at least two spots which have been modulated by elements at opposite halves of the array in the u direction. In FIG. 9a, the different symbols (square, circle, etc.) represent spots written in different passes. In each pass, the workpiece grid is built up by elements along a line in the scanning direction across the array as described in FIG. 2. Depending on how the interlace parameters are set up the points contributing to one local area on the workpiece may be closely spaced on the array or spread out along the entire oblique line across the array, roughly corresponding to the two cases in FIGS. 8a and 8b. The possibility to bring elements spaced far apart on the array to a small neighborhood on the workpiece is one of the benefits of the technology disclosed. Since every neighborhood has contributions from more or less the entire array, there will be no image of the array visible. If, for example, one corner of the array makes a weaker imprint/signal, that corner will contribute spots everywhere on the workpiece. The result will be a slightly higher variance everywhere, but the effect of the corner cannot be seen anywhere in particular.

FIG. 9b shows how multiple partial images can be printed with a series of array positions partly overlapping and forming a stripe in the q coordinate direction, as defined in FIG. 2. A series of partial images thus form a stripe and many stripes (not shown) are stitched together in the p direction to fill the entire area in one pass, represented by the position 1 in FIG. 9b. The next pass, marked 2, is written in the same way, but with the stripes displaced from pass 1 in the p direction (horizontally, in FIG. 9c.) Different passes are marked with different line markers. After two passes, a neighborhood 901 is built up by spots written/read along two lines 906, 907 across the array. Some of these lines are split between the ends 906, 908 in order to accommodate all the partial images in one pass. FIG. 9c shows how the addition of four passes give the distribution of elements in FIG. 9a with the local environment being written by spots taken from oblique lines on the array. The number of passes 2 and 4 are mere examples, and FIG. 9 can be extrapolated to any integer number of passes.

The second result of multipass writing is that the density of the combined grid is higher than for a single pass, thereby improving resolution and image fidelity. The offset between the passes are at several levels: the stripes are displaced in p. The partial exposures are also preferably displaced in q between passes. Furthermore, the passes are displaced in the workpiece grid, so that a denser combined workpiece grid is created. Finally, the passes may be displaced within a cell. The combined displacement consisting of displacements on one or more of these levels, is programmed into the scanning system and also fed to the data path so that the rasterization engine is aware of where each spot is placed and by which modulator/detector element it is written/read.

The disclosed writing strategy does not depend on how the relative translation of the array and the workpiece is implemented. Relative translation may be implemented as a reciprocating mechanical movement, FIG. 9d, with a writing stroke and a non-writing retrace stroke. FIG. 9d shows such reciprocating writing for a single pass. In FIG. 9e, a similar reciprocating writing scheme is shown for a second (or third, fourth, etc.) pass which is identical, except that the writing stroke is the reverse of that in FIG. 9d. It is generally agreed that for high quality printing, not only with spot arrays but with any writing engine, it is difficult to write in a meandering fashion, i.e., one stripe forward and the next backward. There are many subtle effects of the writing direction, such as time delays in the electronics, servo behavior, focus metrology, etc., and the forward and backward stripes of a meander scheme do not stitch together invisibly. Therefore, the writing schemes of FIGS. 9d-e is standard in most high-quality applications, although it is far less effective than a meandering scheme would be.

Figure 9F:
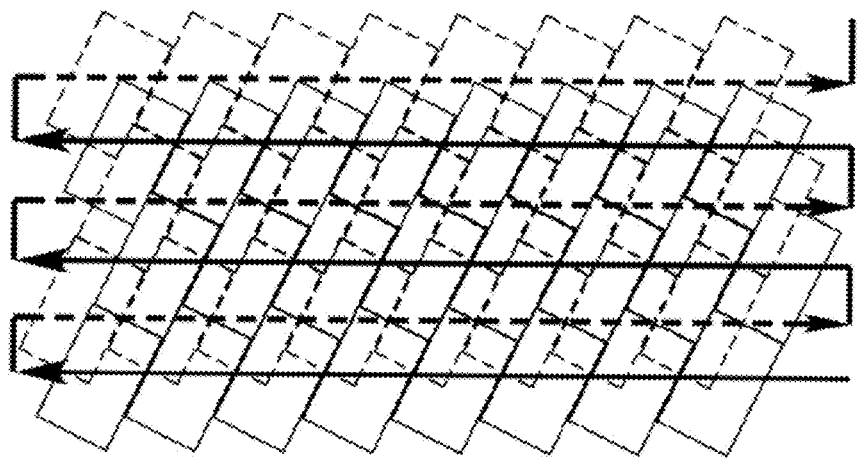
Figure 9E:
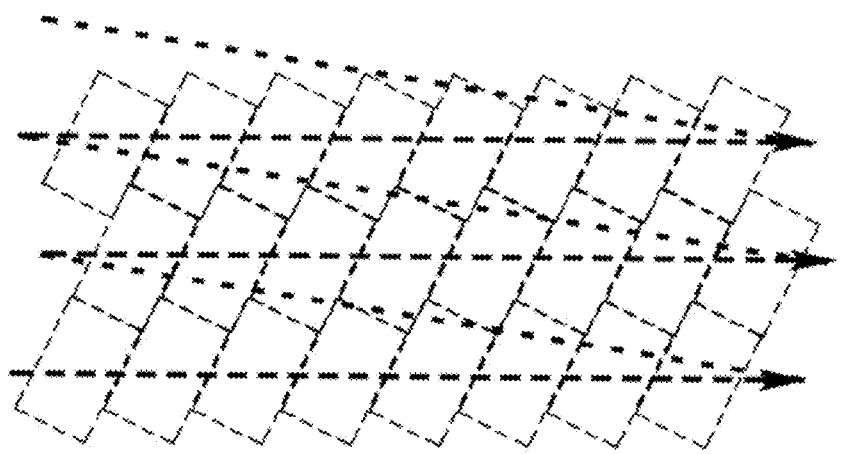
Figure 9D:
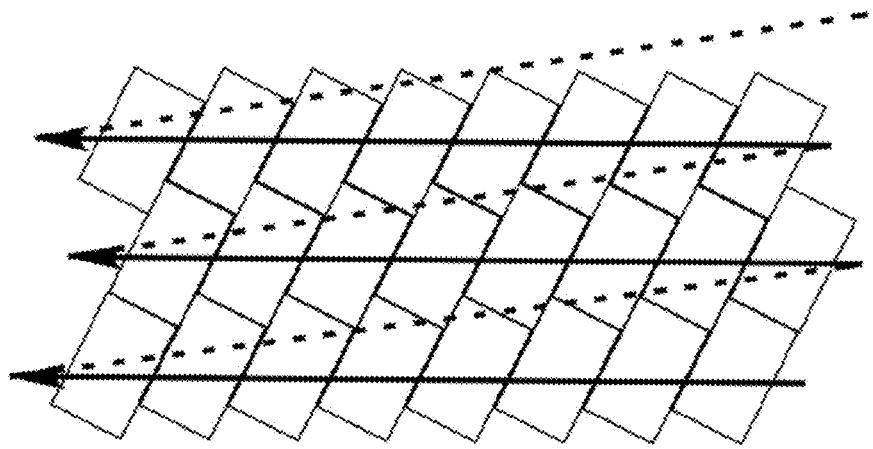

In FIG. 9f, this problem is solved in the context of multipass writing by writing two passes in a two-pass combined writing operation: pass 1 is written with forward writing strokes like in FIG. 9d and pass 2 is written with backward writing strokes, which are the retraces strokes in FIG. 9d. Forward stripes are stitched to forward stripes and backward strokes are stitched to backward strokes. 2n (n is an integer) passes may be written by n two-pass combined writing operations or the two-pass combined writing operation may be generalized to a 2n pass combined writing operation. For example, a four pass combined writing operation may consist of stripe 1 pass 1 forward, stripe 1 pass 2 backwards, stripe 1 pass 3 forward, stripe 1 pass 4 backwards, stripe 2 pass 1 forward, stripe 2 pass 2 backwards, etc. The order may be changed, and forward-backward may be exchanged, but multiple passes are written forward is always stitched to forward and backward to backward such that each pass has only forward or backward stripes. This writing scheme may favorably be used for spot grid writers, writers using optical one- and two-dimensional SLMs and acoustooptically or mechanically scanned raster-scan machines.

Binary Rasterizing

Rasterizing may be implemented in a couple of fundamentally different ways depending on whether the modulators are binary (on/off) or analog (multiple states). FIG. 10 shows rasterizing for a writing system with a binary modulator/source array. In FIG. 10a, a workpiece grid 1002 is shown and a feature 1001 to be written. The feature in the example is a dark feature in a clear (exposed) background. Spots are written or not depending on whether the center point of the spot 1002 is outside 1003 or inside 1004 the boundary line of the feature. This rasterizing scheme has attractive features: it is simple and easy to understand. The address resolution at first sight is not better than the pitch of the workpiece grid. However, when the workpiece grid is rotated from the feature edges in the pattern by an angle alpha (FIG. 10c), which is typically 20-45 degrees, and when the size and fuzziness of the spot is determined by the finite optical resolution indicated by the circle 1011, the edge will be considerably smoothed. The spots are written depending on whether their centers are inside 1009 a feature 1007 or outside 1010. With the rather large angle alpha, the rasterized edge will have high edge roughness, but the fundamental spatial frequency along the edge is high enough to be removed by the optical filtering brought about by the limited resolution. The optical resolution may be represented by a spot function and can be further represented by the FWHM width of said spot. The result may look like the features in FIG. 10d, 1012.

One may think of the edge as snapping to the rows and columns of the grid. With an angle between the edge and the grid, the snapping changes very quickly along the edge and the snapping pattern may repeat or not repeat depending on the exact value of the angle. A repeated snapping pattern with a short period may cause visible moiré artifacts or mura. Repeating the same pattern with long intervals, e.g., after 10 features in the pattern is unlikely to be noticed. Non-repeating snapping is safe from all moiré effects. If the tangent of the angle alpha is not a rational number with small integers, there will not be any short repeated patterns and moiré effects are unlikely to occur. If the tangent were a rational number with small integers (e.g., 3/5, 2/7), the unevenness of the edge would repeat identically with a short period, possibly creating mura. If the rational number is n/m the edge repeats itself with the period m, e.g., 2/7 repeats with the period 7. Since within a period of 7 there are only 7 spots closest to the feature edge there are only 7 possible average positions for the written edge per division in the workpiece grid. If the tangent of the angle is a rational number with large integers, e.g., 2001/7099, there are many possible average edge positions (2099 positions or in practice infinitely small address grid.) The edge of the written feature will still have a random shape like in FIG. 10d, but the average along the edge will be very accurate. FIG. 10d shows how local width measurements 1013 will give varying line width values. If, however, the width is measured as the average over finite-length windows 1015, the values will be much closer to the value in data and with a smaller statistical spread. The average width will be better the longer the window is. For patterns with rather large features, like TFT transistors, the effective design grid will be very small, while patterns with small and short features like semiconductor memories will benefit less. Using binary modulation and a rotated grid for virtual grid may, thus, be very efficient to reduce grid snap and mura for some patterns like LCD and OLED displays, but will give a level of edge roughness that may be objectionable in other patterns, e.g., semiconductor memories.

The simple rasterization based on whether spots are inside or outside a feature works transparently in multipass. Each pass is rasterized independently and more passes will, provided the offsets discussed in relation to FIG. 9a, give better edges and fewer grid artifacts.

Figure 10B:
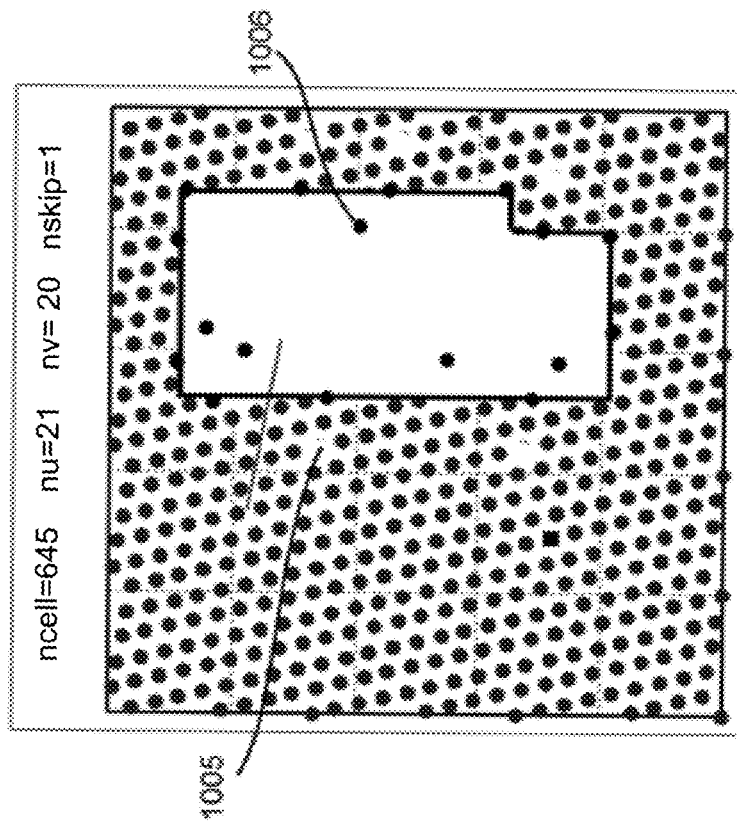
Figure 10A:
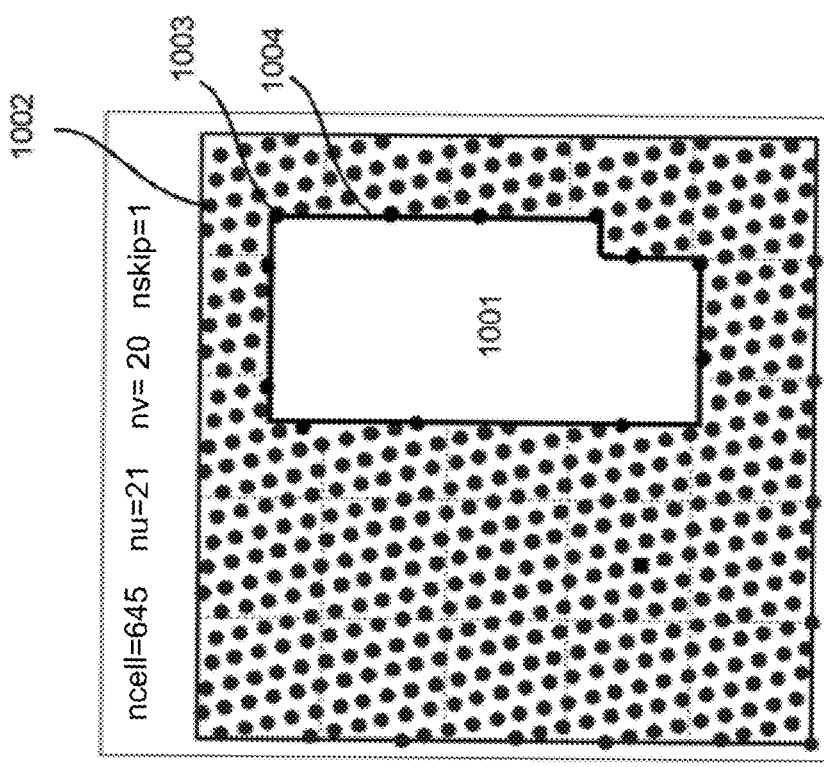
Figure 10F:
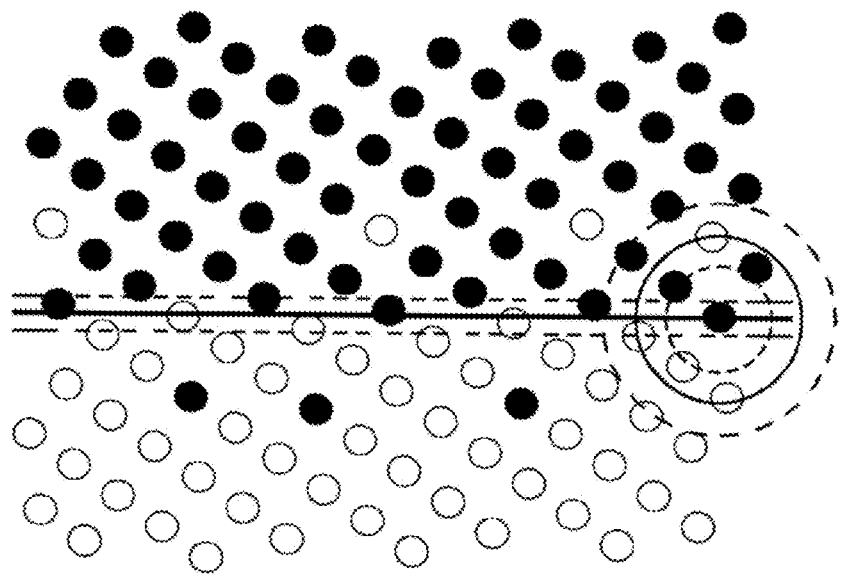

With an alternative slightly more complex rasterization method, the edge roughness can be reduced as shown in FIG. 10b. Each spot can only be on or off. For a spot located on the edge, one would like to turn it on half way. If one chooses to turn it on fully, the edge will have a protrusion around the spot's position, but if the spot is turned off fully, there will also be an error. In either case, there is an error of around half a spot unit. In the alternative, slightly more complex rasterization, the spot on the edge is turned on (or off), but the edge is compensated for the error by the turning off (or on) of one or more auxiliary spots further away from the edge. One such spot 1006 located at a distance from the edge and perpendicular to the place of the error on the edge is shown. A suitable distance for half the effect of an adjacent spot is half the FWHM width of the optical system spot function, and further away for smaller errors.

Figure 10E:
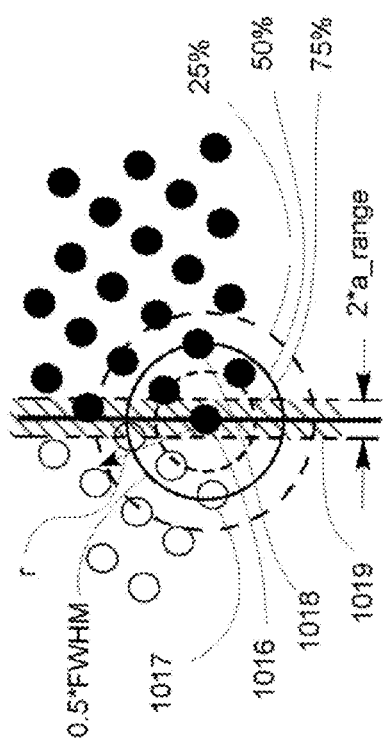
Figure 10E:
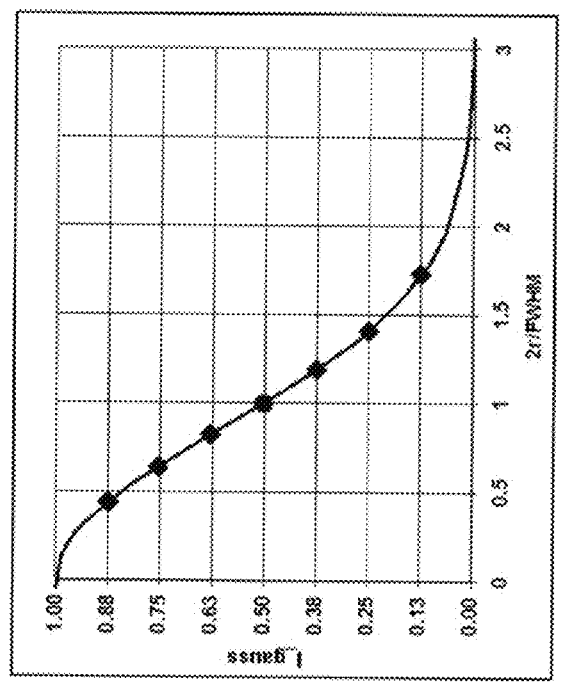

FIG. 10e shows the cross section of a spot and how it has less influence on the dose for location further away from the center. For multiple passes, the scheme works better if the auxiliary spots can be assigned among the spots in all passes. To do so, the rasterizing engine may rasterize to the combined multipass grid at once, or alternatively rasterize to the multipass grid in every pass and throw away the data that is not used in the current pass. The most suitable scheme may depend on the relative cost of processing and storage and may change from time to time and from application to application. With the complete multipass data available it is further possible to mathematically predict the location of the edge, e.g., by convolution with the spot function and thresholding, and modify auxiliary non-adjacent spots to correct predicted edge errors. Mathematically, this can be set up as a linear optimization problem with each spot in the neighborhood contributing to the dose at the desired edge position. The intensity at a number of positions along the desired edge can be described by a system of equations, which can be solved for the photoresist threshold dose at the edge positions. Spots may be turned on and off until the error in the dose at the edge positions is minimized and the optimal solution will be found.

The solution may look like FIG. 10b, where the spots are essentially turned off inside the dark figure, but with a small number of spots toggled or reversed to the opposite state in a zone close to the edge but not immediately adjacent to the edge. In order to reach a certain edge quality, e.g., low edge roughness, a coarser grid may be used relative to what is used with the simple rasterization scheme in FIG. 10a. A coarser grid translates to higher throughput, less expensive writing hardware, and/or fewer writing passes for the same quality.

Note that the rasterization described in this paragraph is not limited to square grids, and not even to regular grids. Grids with rectangular, centered rectangular, hexagonal or oblique lattices may be rasterized by the same methods. It is also possible to use the same methods for rasterization of irregular grids as long as the rasterizer knows where each grid point is located. An example is a grid that is intended to be regular, but because of optical distortion some of the grid points are displaced from their intended positions. The new location is known from the design or from calibration. Calibration in this context means that their apparent position in the image is measured by comparison to a known fiducial, detector or other known artifact. The rasterization may be based on the real or the nominal position of each point or a combination of both, corrected to statistically give more true reading/writing of the pattern.

The corrected positions of the grid points are found by modeling of the errors when writing a statistical mixture of patterns. The best position is where the average error caused by an assumed error is minimized for a realistic mix of patterns. The corrected position of a grid point $r_{corr}$ is $$r_{corr} = r_{nominal} + (r_{actual} - r_{nominal}) * c_{corr}$$

where $r_{nominal}$ is the nominal position, $r_{actual}$ the actual position as calibrated and $c_{corr}$ is a scalar constant chosen to statistically minimize the error.

It is possible to write with multiple passes with a hybrid method: write a number of passes with binary modulation and let one or several of the passes have a reduced writing dose and take this into account in the rasterizing. Each spot can then have not only the values on and off, but for example 0, 33%, 67%, and 100% if there are one pass with one power and another with half that power. Addition of one or more passes with reduced dose may help to avoid edge roughness and improve the address grid. In particular the grid points at the feature boundary in FIG. 10a may be set to intermediate values between 0 and 100% (33% and 67% in the example) and the spots with inverted values in FIG. 10b may also be adjusted in smaller steps. It is not clear without computer simulation of the residual errors which is better for image fidelity, writing more points at the same dose or writing points at a reduced dose. Each scheme, binary and hybrid, will in a particular case have a necessary grid density, and computer simulation can give what the numbers are.

Analogy Rasterization

Most previously known writing systems use a square or rectangular grid and methods are well known for rasterization of data for such a grid. As disclosed, the grid may be skew and/or rotated and it may even be irregular.

FIG. 11 shows how the data can be rasterized for such grids. FIG. 11a shows how any grid, regular or irregular, Cartesian or skew (regular skew is shown) can be rasterized by assigning to each grid point a value that is the overlap between the feature in the data and the cell around the grid point. The cell can be defined in many ways, FIG. 11a shows how the boundary to the next cell is drawn half way to the next grid point. This works for both regular and irregular grids. The overlap may be calculated analytically from the vortice locations of the cell, or by a supersampling algorithm: a finer grid (sampling grid) is superposed on the cell and number of sampling grid points in the overlap area are counted. In a further elaboration a weight function may be added, so that sampling grid points close to the center are counted with a higher weight than those near the edge. The supersampling grid and weights may be stored in a look-up table for fast access. The supersampling algorithm is accurate and flexible and may be programmed in a graphics processor or FPGA, but it uses relatively high computational power.

Figure 11A:
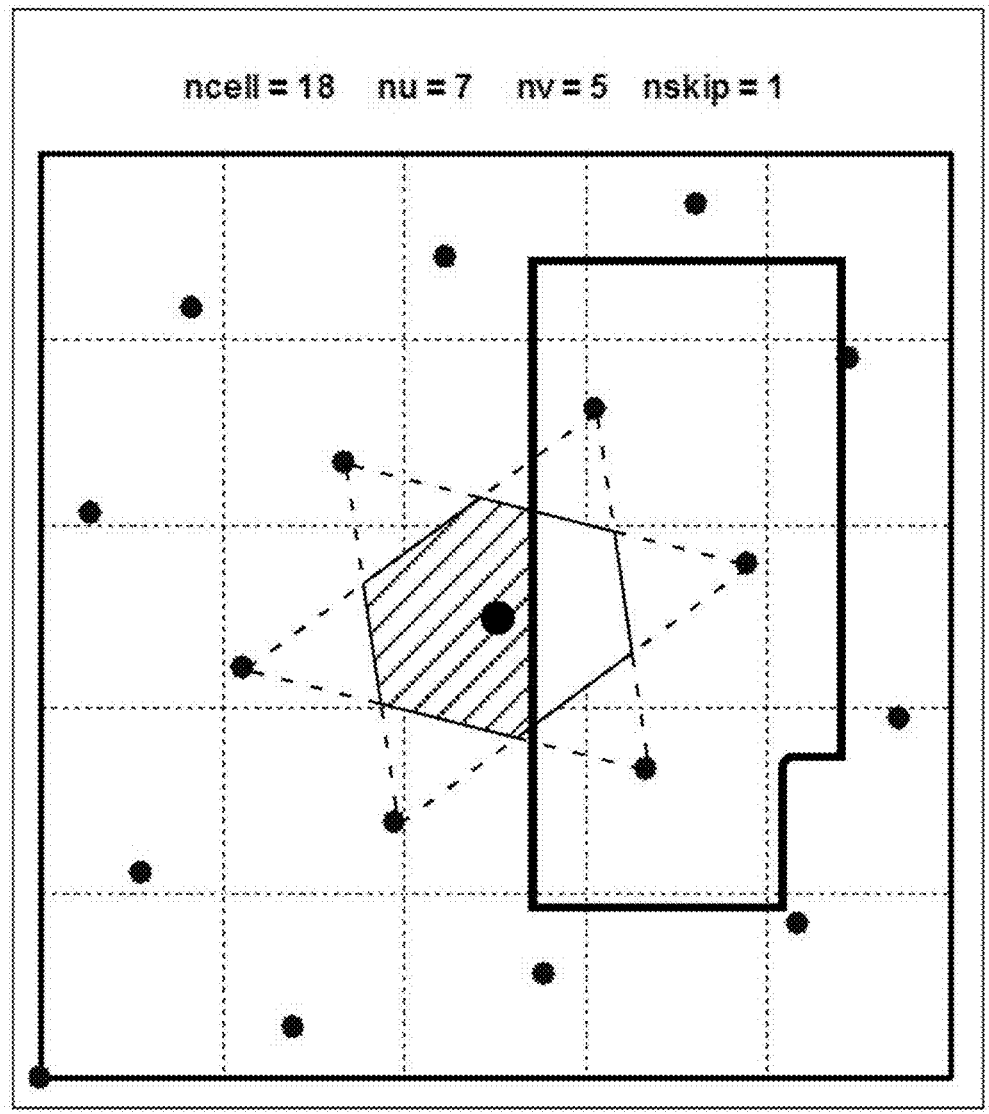
FIGS. 11a-e show rasterization for analog writing.
Figure 11C:
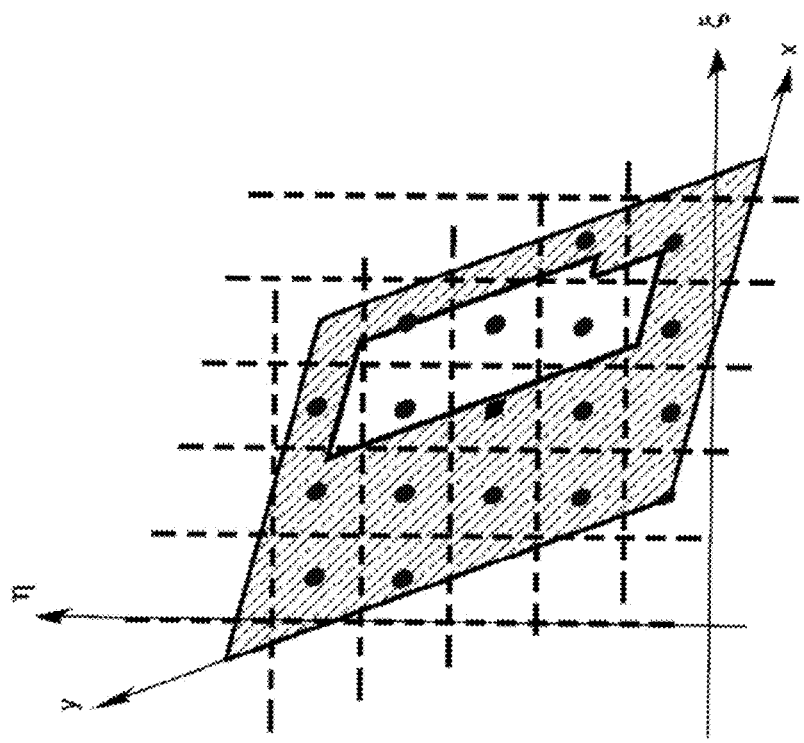
Figure 11B:
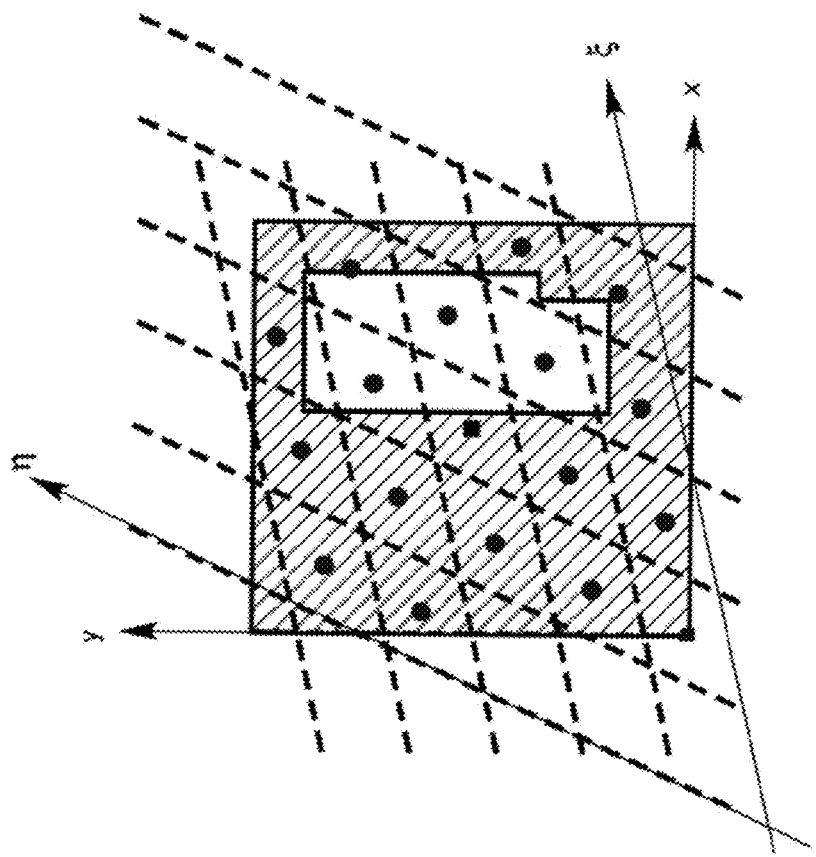
Figure 11E:
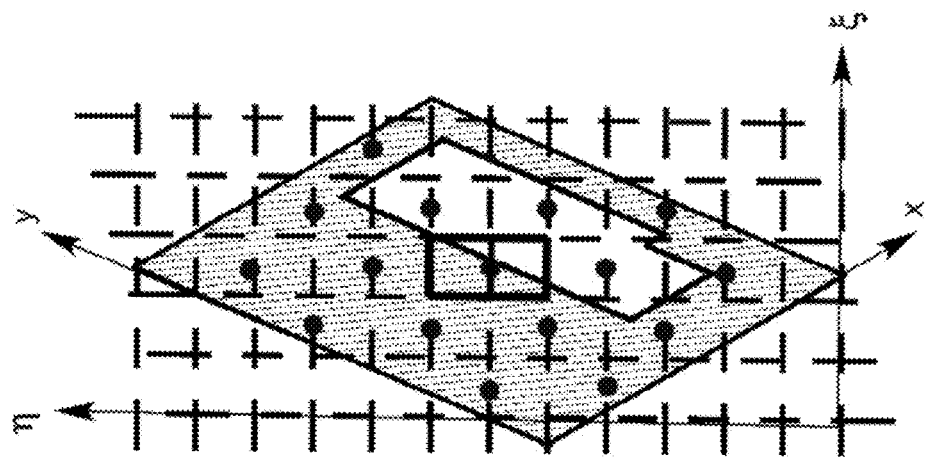
Figure 11D:
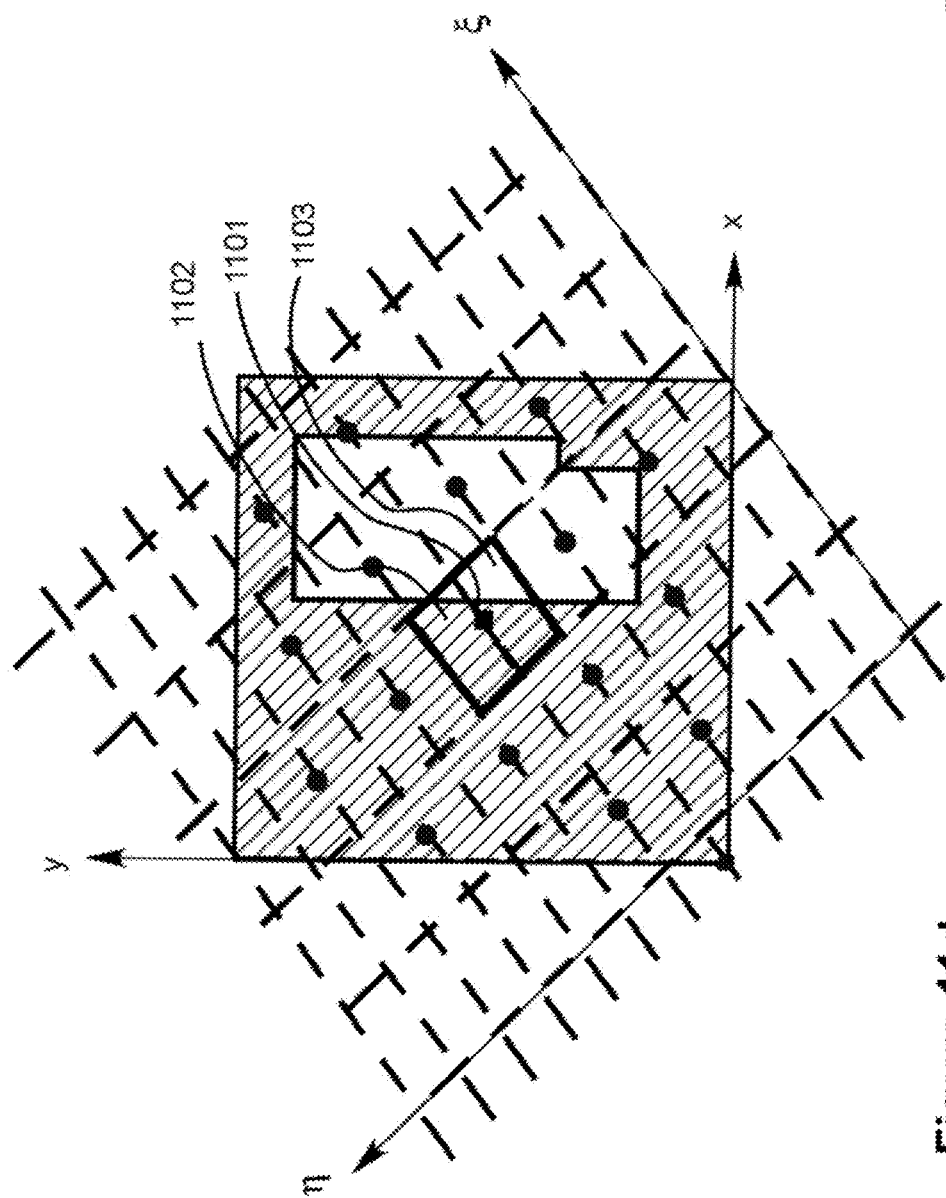

FIGS. 11b-c show how a regular skew (oblique) grid may be rasterized by a graphics processor which assumes a square grid. A unit cell is defined around each grid point, typically the same shape for each grid point. The entire pattern is then linearly transformed, i.e., every (x, y) coordinate is multiplied by a transformation matrix which scales and rotates the pattern to make the skew grid square and/or the unit cells square. The coordinates of the input pattern are transformed by the transformation matrix and the result is fed to the rasterizer. Presumably, the rasterizer may be a graphics processor, e.g., a video rendering chip for a PC, which is inexpensive and has high capacity to render polygons into square bitmaps. Another way to describe the rasterization is that the pattern and grid are transformed together so that the Cartesian (x, y) coordinate system and the skew (xi, eta) system are converted into a skew (x, y) and a Cartesian (xi, eta) system. When the pattern is written, the grid of the writing system is untransformed and the calculated values for each spot are used.

FIGS. 10d-e show a variation for grids that are very skew, like when the grid approaches a hexagonal grid. The unit cells in FIG. 11c are then rather elongated and the writing properties, e.g., resolution, may differ between horizontal and vertical or between other perpendicular axes. Another grid is then defined with two or more cells per grid point (two cells shown 1102, 1103) and these cells are transformed to a Cartesian grid. After rasterization the values of the two or more cells are added and assigned to the grid point 1101.

Datapath Architecture

Figure 12A:
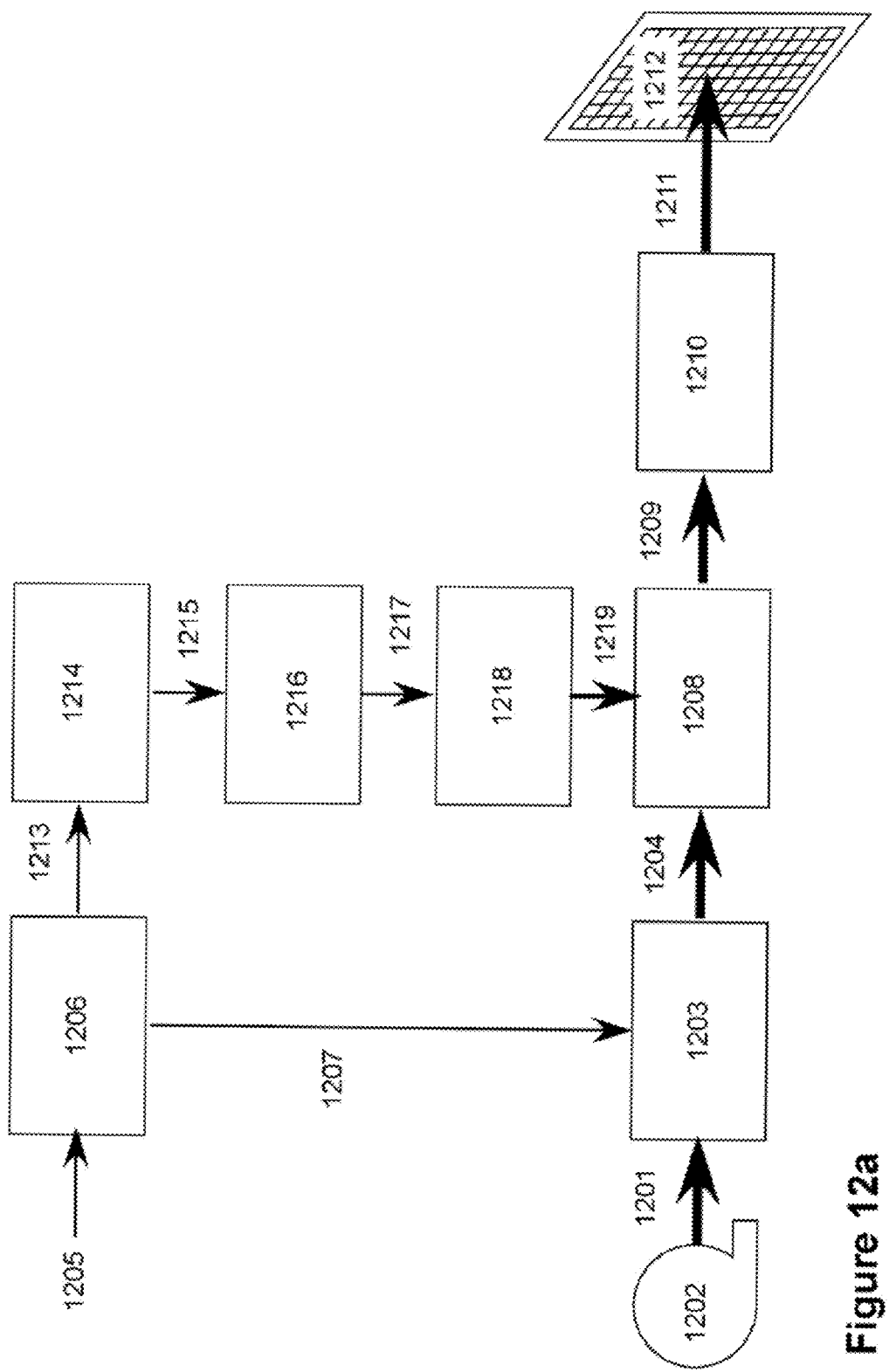
FIGS. 12a-d show embodiments of a data path for the writing system based on the technology disclosed.

A datapath architecture for a writer is shown in FIG. 12a. The ordering of the data that is sent to the array is far from easy to understand or set up intuitively. The so-called "complex two-dimensional interlace scheme" used in this disclosure, is complex in the sense that a normally gifted person cannot sort out the interlace without help from some computing device. It also is complex in the sense that there is no explicit formula connecting a spot on the workpiece to the writing pass, partial image and address on the array. Still the datapath has to make this connection for every piece of data at high speed. The following describes how the problem of sending the right data to the correct modulator despite the lack of an explicit relation between them is solved, with reference to FIG. 12.

The datapath in FIG. 12a takes input data 1201 from storage 1202, rasterizes it to a bitmap 1204 by a rasterizing engine 1203. The input is typically described by vector data in the (x, y) system and it is rasterized to a bitmap in the (xi, eta) system. The relation between x, y and xi, eta may be a rotation and scaling. The data in the (xi, eta) grid is ordered completely different from how the data will be used in the writing hardware. Before the bitmap is conditioned 1210 into signals 1211 to be sent to the modulator/source array 1212, it is reordered into the order used by the array. This is done in the data reordering module 1208 based on a look-up table 1218. Each point in the (xi, eta) has to be converted to pass, partial image and modulator coordinate. Alternatively, each modulator has to reach into the bitmap to find the value assigned to it. This is governed by a pre-calculated address look-up table or address conversion table 1218.

FIG. 12a shows how this address conversion table is created. The writing job is described in setup input data 1205 defining the grid parameters, the number of passes, the array dimensions, etc. This data is, suitably reformatted 1207, sent to the rasterizer 1203 and to a relocation calculator 1214 which has a model of the machines, simulating the writing operation and outputting a look-up table 1215 with workpiece coordinate (e.g., in the (xi, eta) system) for each modulator, partial image and pass. This table 1215 is reordered, typically by sorting, in a reordering module 1216 to produce a new reverse look-up table 1217 of pass, partial image, and modulator coordinates as a function of grid position in the workpiece grid (xi, eta). To efficiently reorder the data the (xi, eta) bitmap is masked or sampled and the samples are sent to storage areas corresponding to the partial images. In this operation the data is reordered according to reverse look-up table 1217. The procedure to calculate the reverse table u, v(xi, eta) 1217 by sorting of the forward table xi, eta(u, v) 1215 is practical and efficient, while the direct calculation of the reverse table 1217 may be mathematically difficult.

Alternatively, the storage area corresponding to the partial image, i.e., one loading of the array, is addressed one cell at a time (in the algorithm, an implementation may run several instances of the algorithm in parallel) and the address where that value can be fetched is found in the look-up table 1215. The (xi, eta) bitmap is held available in storage and the values are fetched from it.

Figure 12B:
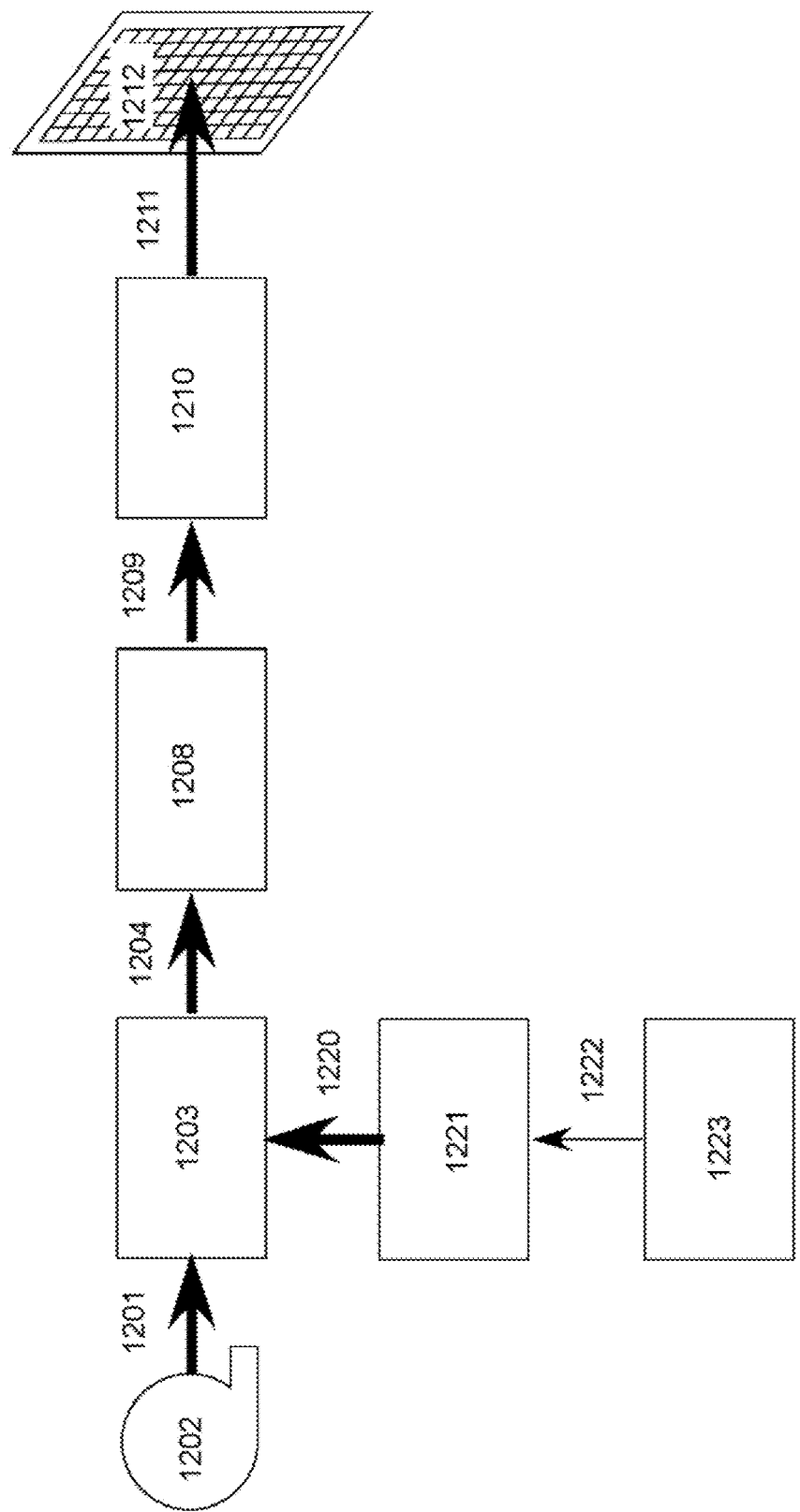
Figure 12C:
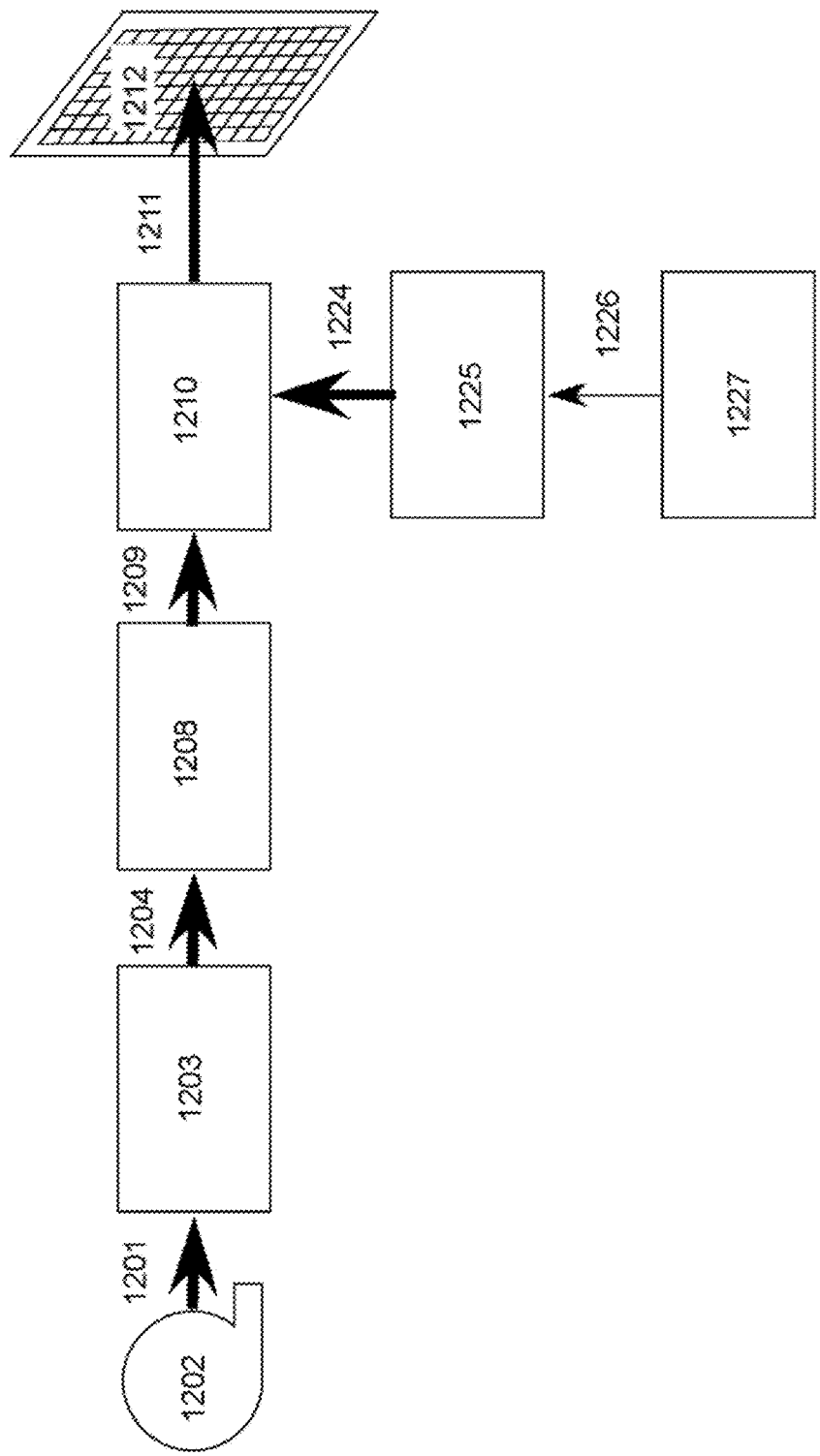

The architecture in FIG. 12a can be used for both binary and analog data. FIG. 12b shows how errors in the array or optics can be corrected. The core of the data path is the same as in FIG. 12a. The rasterizing 1203 is done with knowledge about errors in the arrays and/or imperfections, e.g., distortion, in the optical system. The errors 1220 are fed to the rasterizer 1203 from an error storage 1221. The errors may be found, either by prediction from known characteristics like distortion of the optical system, from measurements of written artifacts, or from calibration procedures in the writer. For imperfections in the array or optics, it may be convenient to store the errors in (u,v) coordinates and have a look-up conversion table, e.g., 1215 in FIG. 12a, to assign the effects of the errors to grid points in the grid in the rasterizer.

In the general case, the modulator/source elements in the array 1212 have different properties and may be corrected when the data is converted to the signals 1211 driving the array. The individual characteristics may be stored in a look-up table 1225 based on calibration hardware and software 1227.

Figure 12D:
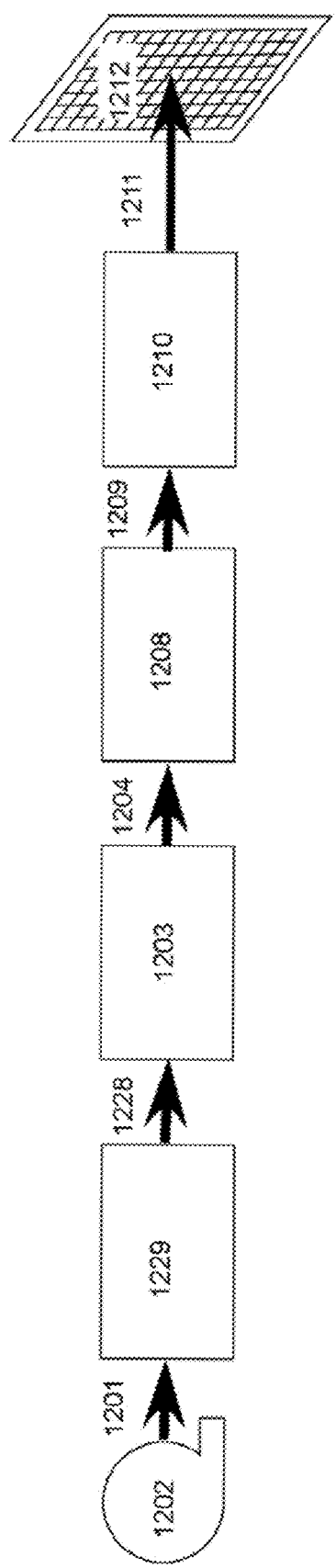

In FIG. 12d, the conversion from vector input data 1201 in (x, y) to a (xi, eta) bitmap is done in two steps: first the input is converted in a first module 1229 to an intermediate format 1228 in (x, y) such as an (x, y) bitmap, and then this intermediate format is rendered or rerendered into a (xi, eta) bitmap 1204.

For an image reader based on the same 2D interlace scheme, the data path is essentially the same but with reversed data flow: The signals from the array are converted to digital values and by means of a look-up table the data are unscrambled to produce a (xi, eta) bitmap. This is then transformed to an image in the x and y.

Optical Direct Writer Embodiment

In this section, we disclose an embodiment of an optical direct writer for writing LCD backplanes with an optical resolution of 3.5 microns and a minimum feature size of 5 microns. The resist has a sensitivity of 30 mJ/cm$^2$.

The modulator array in the preferred embodiment is a Texas Instruments HDTV DLP (Digital Light Processing) chip with 1920×1080 binary mirrors and max frame rate of 23 kHz. The mirror to mirror pitch on the chip is 10.8 microns. The chip is oriented as in FIG. 2 with the translation vector being along the shortest axis, but tilted at an angle. The long axis of the chip defines the stripe width and the entire width can be used. In the direction of translation, the utilization of the chip depends on the interlace parameters. A preferred set of parameters is $n_{cell}=481$, $n_u=9$, $n_v=9$, $n_{skip}=29$ and to the basic fractional translation vector a vector (0, 1) cells is added. This makes 98% of the mirrors contribute to the throughput, i.e., the pixel throughput is 98%*1920*1080*23 kHz=45 Gp/s.

To create a 0.71 micron grid after two passes, the optics magnifies the chip 2× and uses an optical field of 48 mm. The translation vector is then (u, v)=(11.900, 48.377) microns. The stage velocity is 1054 mm/s and the raw writing speed 1.30 m$^2$ per minute. To write a G10 substrate (3400×2600) in 75 seconds, six units should suffice, assuming 10% mechanical overhead. The optical power of 7 W at the image plane should suffice, which typically requires about 20 W raw power, subject to realistic optical losses. The light source is a q-switched tripled Nd-YAG laser with 355 nm wavelength, 23 kHz repletion rate, and 40 ns pulse duration. The laser's TEM00 beam is split into 1920×1061 Gaussian beams, each one directed to the center of a DMD mirror, but with the actual focus spot some distance from the mirror. The beams are modulated by the mirrors and the array of modulated spots are imaged onto the workpiece. The stage is a flatbed stage. The data is rasterized as in FIG. 10a.

Tracking the Workpiece

Many of these and similar techniques require pulse beams in order to freeze the scanning movement of the array. Reference 5 is interesting in the sense that it uses continuous motion and continuous illumination and still gets exposure of one spot from one array element by tracking the stage motion. This is done by scanning the beams from the modulator in order to follow the substrate. The same can be done with optical beams and a short-stroke deflector such as an electrooptic deflector.

Figure 13:
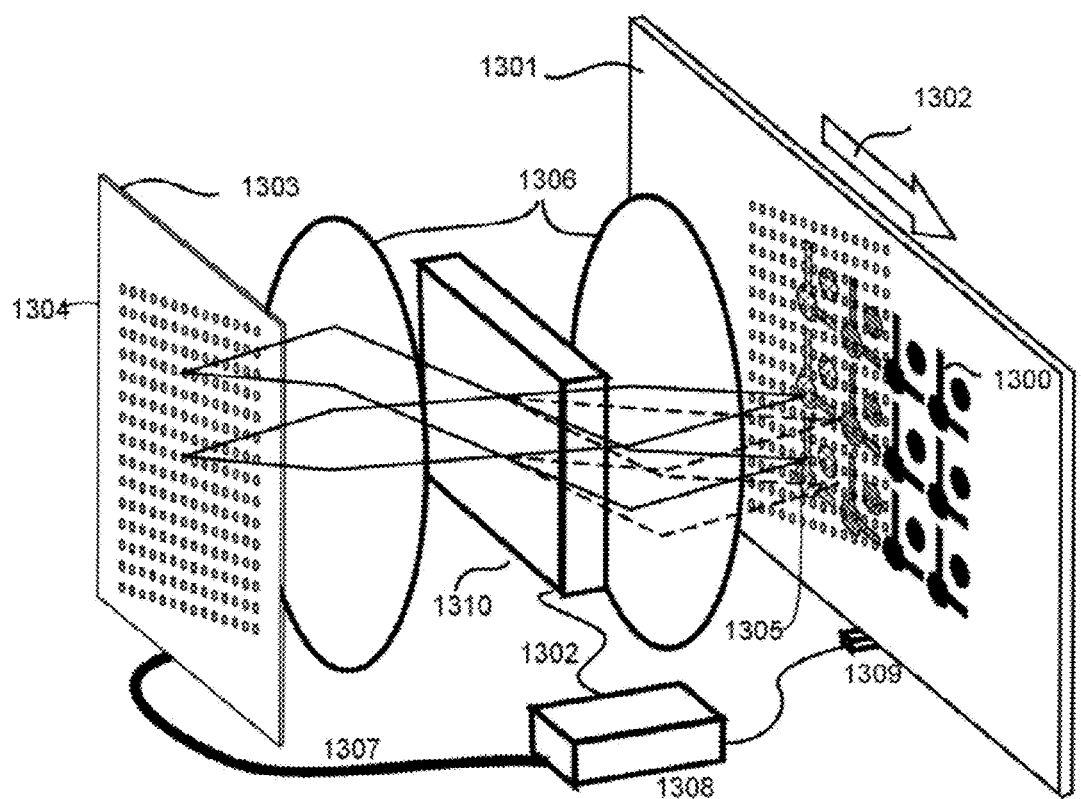
FIG. 13 shows an embodiment of a reading or writing apparatus having optional tracking hardware.

FIG. 13 shows a modified and improved imaging apparatus, either reading or writing, similar to the one in FIG. 1. The array is rotated and the translation is modified according to the description above, allowing the elements in the array to be used with relatively infrequent overstrikes, thereby allowing larger arrays to be used with proportional scaling in throughput.

The elements are essentially the same as in FIG. 1: pattern to be written 1300, workpiece 1301, translation direction 1302, source array 1303 (either consisting of sources itself or modulating a beam at each element), source elements 1204, image of source elements 1305, a system 1306, e.g., a projection system for making the beams on the source array become spots on the workpiece, data input 1307 to the source array from a datapath and/or controller 1308 based on position sensing 1309 of the workpiece. For a reading system, a detector array is used instead of the source array and the direction of causality (radiation, mechanical force, etc.) is reversed relative to that in a writing system, i.e., from 1301 to 1303.

FIG. 13 shows as an example embodiment, an optical writer/reader and in the optics is inserted a short-stroke deflector 1310, e.g., an electrooptic deflector, acousto-optic deflector, a mechanically scanning mirror, prism, or diffractive element. The description above has used short exposure times to freeze the motion of the workpiece relative to the image of the array, but with the added deflector 1310 continuously lit beams can be made to freeze the spots by tracking the workpiece 1301. The two sets of rays behind the deflector show alternative paths, the solid lines at an earlier time and the dashed one an instance later. The tracking may be over a distance equal to or slightly less than the translation vector described above. This may be important in two types of example embodiments: using a source array with continuous light sources and using a camera as detector array. Continuous light sources may be illuminated from the back side by a continuous laser or other discharge lamp, but it may also be an array of LEDs or lasers, e.g., semiconductor lasers or VCSELs.

In contrast to separate lasers, e.g., Q-switched tripled Nd-YAG lasers, semiconductor lasers cannot store large amounts of energy as inversion and release then as a short intense pulses. With semiconductor lasers, the laser can be pulsed but below a certain duty cycle, e.g., 25%, the average power falls, in fact becoming proportional to the duty cycle. Therefore, semiconductor lasers are unsuited to freeze the motion by short pulses, and the short-stroke deflector in FIG. 13 may be used to get the same effect on the workpiece, but with preserved average laser power. To preserve average power the workpiece may be tracked for 25% of the time between frames or more, i.e., 25% over 25% of the translation vector, or preferably over more than half of the translation vector or a corresponding time. VCSELs do not have the same limitation of modulation frequency as some spatial light modulators, e.g., micromechanical mirrors or LCD arrays, and a small array of VCSELs may give the desired pixel per unit time throughput. However, using a large array may give higher total power and writing speed in power-limited applications.

A reading system may use the same described system for workpiece tracking to integrate the power from each spot on the workpiece to raise the signal-to-noise quality of the reading the image.

High Power

FIG. 14 shows in schematic for elements of a high-power preferred embodiment using high power laser light. The figure shows how a spot array 1400 is formed on a workpiece 1401 by laser pulse 1402 modulated by a spatial light modulator (SLM) 1405 and projected by a lens system 1408. The laser beam is converted to a number of beamlets 1404 impinging on the cells of the SLM, and going through the post-SLM optical system 1408 to define spots 1400 on the workpiece. The SLM may be a micromirror device, e.g., a DMD, with mirrors 1406 having on-off action. The laser beam 1402 is preferably a pulsed laser, e.g., Q-witched or having nanosecond, picosecond or femtosecond pulses. The SLM may be adapted to high power by having a heat-conductive gas fill 1411 on the mirror side and a forced fluid cooling 1412, e.g., using water, freon, hydrocarbon, air, hydrogen, etc. on the back side.

The mirrors may be having a high-reflectance stack, or be coated with a metal film such as made from aluminum, gold, rhodium, osmium, or other bright and/or refractory metals. The mirrors control whether the laser light hits the workpiece or a beam dump 1409 depending on the loaded data (not shown). The light is focused to the center of the mirrors in order to avoid cross-talk, which adds randomness to the dose in each spot, and to avoid sending high-energy light into the slits between the mirrors. Beams into the slits cause reduced contrast, loss of optical power in the image, and it is believed that it contributes to early failure of the SLM. These problems are solved or avoided by using the central part of each mirror. Each beamlet has a focus 1407, but in order to avoid burn-out of the mirror the focal spot is located away from the surface of the mirror. In this way, the footprint of the beamlet on the mirror can be made larger than the focal spot and a compromise between cross-talk, light into the slits, and size of the focal spots can be achieved.

In a preferred embodiment the mirrors are 13×13 microns and the focal spot is desired to be 2 micron FWHM. The lens array 1403 forming the beamlets is placed at a distance from the SLM which makes the footprint on the mirrors approximately 9×9 microns (since the array is square the lenslets are square and the beam is also square at out-of-focus positions). In this case, approximately half the area of the mirror is used for modulating the beam. The projection optics project the modulated spot grid 1407 on the spot grid 1400 on the workpiece and the methods described above may be used to select a writing grid orientation and density, while the magnification or demagnification of the projection optics 1408 determine the size of the spots on the workpiece 1401.

In some high-power applications, there is a problem with outgassing, dust debris, etc., which may settle on the lenses and cause damage or loss of performance, e.g., when the technology disclosed is used for laser ablation. It is then desirable to have gas purging of the final lens so that a positive gas flow protects the optical surfaces. In particular, a hood may be mounted around the final lens and purged so that dust and debris emanating from the workpiece will meet head wind before reaching the lens surfaces. Other optical surfaces inducing the SLM may also be suitably purged.

INDUSTRIAL APPLICABILITY

The technology disclosed makes efficient use of large 2D modulator arrays, e.g., DMD devices, that have been made possible by the microelectronic revolution. Arrays with 2 million modulators and a frame rate of more than 20 kHz are commercially available (e.g., Texas Instruments' DMD). It has not previously been possible to use such massive arrays with high efficiency. Typically, the large number of mirrors have led to an unwanted redundancy, i.e., each point on the workpiece has been read or written by more than one modulator or detector element. If each point is written twice, the result is an area throughput only half of what had been possible if it is written only once. The current disclosure teaches how to write a surface-filling grid on the workpiece and have each grid point addressed only once. The scheme has great flexibility and allows grid size, type, orientation and redundancy to be controlled.

We also disclose a method applicable to certain types of illumination patterns, e.g., patterns created using transistor arrays for LCD and OLED displays, which are extremely sensitive to systematic errors. It is very difficult to control the writing system well enough to write an acceptable pattern at high speed, since, for example, an illumination variation over the field of 1% may cause intolerable visual stripes, "mura", in the final product. The technology disclosed provides a method to conceal or obfuscate the systematic signature of the hardware and converts systematic variations to a uniform noise which is much less apparent to the eye.

The display industry has been requesting the development of direct-writing technology for LCD displays, but the development has been hampered by insufficient throughput and inadequate writing quality. Is the our belief that the technology described provides significant advantages in these two respects; it may be enabling for industrial exploitation of direct writing technology in the display industry; and it will be useful in many other image reading and writing applications.

Currently most lithography, e.g., for production of LCS displays, is done conventionally using a photoresist which after exposure and development becomes an etch mask used to delineate a pattern in a uniform pattern deposited over the entire area prior to the patterning. This procedure ensures high quality, but involves many steps, and in some cases, most of the expensive material that has been blanket deposited goes to waste. Therefore, there is an active search for new processes which short-circuit some of the process steps or use less material. Such a process is patterning through laser ablation. The disclosed methods and apparatuses are eminently suitable for patterning by laser ablation. Using the high-power embodiment of FIG. 14, it is possible to use short, intense pulses, which ablate thin solid films. The spot grid can be adjusted for an optimal match between the spot size and the density of spots, and if desired, a specified number of flashes delivered to each spot, e.g., 2, 4, 8 or other integer. Furthermore, the writing order of the spots can be chosen to make every spot fall in a "cold" neighborhood, i.e., where none of the surrounding grid points have been ablated within the last few flashes. With a dense grid of identical on-off spots and a writing strategy that still gives good address resolution, in contrast to a coarser grid of gray-tone pixels, the spot size, energy and pulse-length can be optimized for clean removal of the ablated film. Alternatively, ablation can be used to make pits or a surface profile in a solid surface in a controlled way, with the number of flashes delivered to a point being translated to an ablated depth into the surface. An example of what is needed to ablate a thin metal film: 2 J/cm$^2$ in a 0.1 ns pulse. The discussion related to FIG. 14 gave the footprint on each mirror 8×8 microns. If the spots 1407 are demagnified by the projection lens 1408 to 0.5 microns FWHM, the necessary energy load on the SLM surface is approximately 300 times less, i.e., 6 mJ/cm$^2$, which may be well under the ablation threshold at the SLM. With an SLM of 1920×1080 mirrors and a frame rate of 23 kHz, the machine can pattern 0.3 square meters per minute with a minimum linewidth of less than 1 micron.

Likewise, the disclosed technology's printing spots with a determined energy are suitable for non-linear processes, like thermal processing, fusion, melting, phase-transition, photolytic decomposition, selective activation, etc. One class of patterning starts with a material on a carrier film and the material is selectively transferred to the workpiece, where it is hit with laser radiation. The technology disclosed works well with the general class of methods, which we may call "laser-induced pattern transfer," laser-induced thermal imaging LITI, radiation-induced sublimation transfer Rist, and laser-induced pattern-wise sublimation LIPS." Other processes used in the electronic, optical, and printing industry, where the disclosure may be useful, will be apparent to the person skilled in the art.

Some Particular Embodiments

The present invention may be practiced as a method or device adapted to practice the method. The invention may be an article of manufacture such as media impressed with program instructions to carry out the computer-assisted method or program instructions that can be combined with hardware to produce a computer-assisted device that carries out the computer-assisted method.

One embodiment is a method for relaying pattern information in pulses between an array of at least 100 by 100 elements to spots on a surface of a workpiece. This method includes moving the array is moved between pulses by a displacement vector that creates a regular distribution of a predetermined number of interstitial spots within a cell (FIGS. 9a-f). Interstitial spots are defined by reference to a cell, which, in turn, is defined by cell corners. The cell corners are defined by spots projected from the elements of the array, with the array in a first position. The displacement vector limits an overstriking repetition of particular interstitial spots to no more than 8 overstrikes of the particular interstitial spots as the large array sweeps the surface in one pass. By overstrike, we mean two spots in the same place. That is, moving in the direction and covering the distance set by the displacement vector results causes the array to sweep over the surface exposing spots in one pass that create the regular distribution of spots with no more than 8 superimpositions of spots in the same positions on the surface.

In some implementations, overstriking will be limited to four, or two, or one superposition In an extended implementation of this method, the distribution of interstitial spots is graphically plotted to verify the regular distribution before using the displacement vector to guide the movement of the large array.

In one implementation, information is written from the array to the spots. In an alternative implementation, information is read from the spots using the array.

A further aspect of this method, which can be combined with any of its implementations, other aspects or other features, provides that the regular distribution of the interstitial spots within the cell is substantially balanced, having an imbalance of no more than a ratio of 3:2 along major and minor axes of distribution. We define this ratio as follows. When the regular distribution is inspected, a major axis is selected along a direction of closest spacing of points. In FIG. 6a, for instance, the major axis has a slope of −1. A minor axis is defined as perpendicular to the major axis, which would be +1 in FIG. 6a. The balance ratio is calculated as a ratio of spot density along the major axis to spot density along the minor axis. The distribution in FIG. 6a has an imbalance of more than a 3:2 ratio, by inspection.

Another aspect, which can also be combined with any of the foregoing, further includes the displacement vector having components along two axes of the array. The components are rational numbers of the form a/N and b/N where a, b and N are non-equal, non-zero integers, either a or b is larger than N, and N is larger than 25.

The displacement vector may lie parallel to a line connecting two spots projected from the array in the first position.

A variety of conditions may be satisfied by some or all of the parameters of the displacement vector, either singularly or in combination. At least one of a and b may be larger than 2N. The parameter N may be larger than 100. Parameters a and b may be relative primes, at least after all common factors of a, b and N are factored out. Similarly, a and N may be relative primes, at least after all common factors of a, b and N are factored out. One more possibility is for b and N to be relative primes, at least after all common factors of a, b and N are factored out.

The array may be larger than 100 by 100 elements. Cost effective arrays are available at the time of this application in HDTV dimensions of 1024×768 elements or 1980×1080 elements. The array may include at least as many elements as either of these HDTV configurations.

Another embodiment is a method of relaying pattern information in pulses between elements of an array and spots on a surface of a workpiece. The pattern data is relayed in projection pulses between at least 100 by 100 image elements in an array and corresponding spots on a surface of a workpiece. A regular distribution of sets of spots is interstitially composed and pulse projected onto the surface as the array sweeps the surface in a generally straight line that is at an angle to both first and second axes of the array. The projected spots follow a movement direction and a movement distance between successive pulses.

Furthermore, the sets of spots interstitially pulse projected are regularly distributed within cells that have cell corners, which are defined by the projections of image elements with the array in a first position. The movement direction parallels a line connecting particular spots projected on the surface from first and second image elements with the array in the first position. The movement distance between the projected spots during successive pulses is a rational fraction of a span distance between the particular spots and more than twice a breadth of the cells as measured in the movement direction. Of course, the further aspects, conditions, features and implementations discussed above generally apply to and can be combined with this method embodiment.

In one implementation, the movement distance is greater than four times the breadth of the cells. Under other circumstances, the movement distance is greater than eight times the breadth of the cells. This larger factor would be useful, for instance, with a 1080 by 1920 array, because it would result in about 135 spots per cell. Depending on the movement direction, there could be few or many overstrikes among these interstitial spots.

In another implementation, the rational fraction is selected to control a count of the sets of spots interstitially pulse projected within the cells' corners.

The method may be extended by graphically plotting the sets, of spots interstitially pulse projected to verify the regular distribution, before using the movement direction and distance to relay the pattern data. Graphic plotting is useful, as the properties of various rational fractions and directions have not been sufficiently generalized for one to intuit the results produced by particular parameters.

In some implementations, it will be useful for the regular distributions of sets of spots to be substantially balanced within the cells, having an imbalance of no more than a 3:2 ratio along major and minor axes of distribution. Balance and imbalance are used here as defined above.

Another method embodiment adapts a writing system to different trade-offs between speed and accuracy is disclosed by simply changing the movement vector. This method uses a stage direction of straight travel and repeatedly applies instances of a sparse spot array along said direction of travel. The spot array is arranged at an angle to the stage direction of travel between instances of projecting the spot array. A short distance gives a low speed and high accuracy through a dense pixel grid, and a long distance gives high speed, a coarser grid and less accuracy.

Another embodiment includes a method of forming a pattern by sequentially applied partial patterns, while suppressing any signature coming from field non-uniformities in the hardware forming the partial patterns. Each partial pattern is formed as a sparse pixel array. Partial patterns in a complex interlace scheme are added. Pixels are written into every small neighborhood in the final pattern representing many different locations in the field of hardware. The influence of non-uniformity in one part of the image device field is spread out across the entire final pattern.

Yet another embodiment includes a method of fast writing of a pattern on a workpiece with highly suppressed mura effects. Continuous motion is provided in a direction. A digital mirror device DMD is illuminated with at least one laser source emitting short pulses. The light being modulated by the array of mirrors to a sparse spot array on the workpiece is focused with an optical system. The array is then rotated an angle relative to the direction of the continuous motion. The spot array is translated a distance relative to the workpiece between each laser pulse, choosing the direction and distance so that a unit cell in the spot array is uniformly filled with a fine grid of N spots after the optical system has traversed the cell on the workpiece. Fine grid is rotated an angle larger than 6 degrees to motion direction. The pixel capacity of the DMD is efficiently used, systematic errors in the optical system are effectively dissolved, and a fine address grid is created.

In one implementation, the method includes writing multiple passes.

Another method embodiment includes creating a sub-pixel address grid using an on-off SLM grid. A dense pixel grid rotated by non-zero angles to the x, y, 45, and −45 degree directions and the pattern is created turning on pixels which are inside the written features of the pattern. The dense pixel grid has at least four pixels per FWHM of the writing light.

In an implementation, the pixel values can be close to the edge.

While much of the description in this disclosure is cast in terms of methods, it covers corresponding devices and articles of manufacture. This disclosure covers computer systems that carry out the methods, computer assisted projection and inspection machines that take advantage of the methods, articles of manufacture that include computer instructions adapted to carry out the methods, methods of making computer systems and computer-assisted projection or inspection systems by combining computer instructions adapted to carry out the methods with hardware that uses the methods.

While the present invention is disclosed by reference to the preferred embodiments and examples detailed above, it is understood that these examples are intended in an illustrative rather than in a limiting sense. Computer-assisted processing is implicated in the described embodiments. It is contemplated that modifications and combinations will readily occur to those skilled in the art, which modifications and combinations will be within the spirit of the invention and the scope of the following claims.

I claim:

1. A method of relaying pattern information in pulses between an array of more than 100 by 100 elements to spots on a surface of a workpiece, the method including:
    moving the array between pulses by a displacement vector that creates a regular distribution of a predetermined number of interstitial spots within a cell on the surface, the cell having corners defined by spots projected from the elements with the array in a first position, with a substantial balancing of the regular distribution of the interstitial spots, having an imbalance of no more than a 3:2 ratio along major and minor axes of distribution.

2. The method of claim 1, wherein the displacement vector further limits an over-striking repetitions to no more than four times as the array sweeps the surface in one pass.

3. The method of claim 1, wherein the displacement vector further limits an over-striking repetitions to no more than one time as the array sweeps the surface in one pass.

4. The method of claim 1, further including writing information from the array to the spots.

5. The method of claim 1, further including reading information from the spots using the array.

6. The method of claim 1, wherein the displacement vector has components along two axes of the array, the components being rational numbers of the form a/N and b/N, wherein:
    a, b and N are non-equal, non-zero integers,
    at least one of a and b is larger than N, and
    N is number of grid points per cell and is larger than 25.

7. The method of claim 1, wherein the displacement vector is parallel to a line connecting two spots, a first spot projected from a first row in the array in the first position, and a second spot corresponding to one spot in the last row if the used is one unit deeper.

8. The method of claim 1, wherein at least one of a and b is larger than 2N.

9. The method of claim 1, wherein N is larger than 17.

10. The method of claim 1, wherein a and b are relative primes, at least after all common factors of a, b and N are factored out.

11. The method of claim 1, wherein a and N are relative primes, at least after all common factors of a, b and N are factored out.

12. The method of claim 1, wherein b and N are relative primes, at least after all common factors of a, b and N are factored out.

13. The method of claim 1, wherein the array includes more than 300 elements along a shorter axis.

14. A method of relaying pattern information in pulses between an array of more than 100 by 100 elements to spots on a surface of a workpiece, the method including:
    moving the array between pulses by a displacement vector that creates a regular distribution of a predetermined number of interstitial spots within a cell on the surface, the cell having corners defined by spots projected from the elements with the array in a first position; and
    assigning components to the displacement vector along two axes of the array, the components being rational numbers of the form a/N and b/N, where a, b and N are non-equal, non-zero integers, at least one of a and b is larger than N, and N is number of grid points per cell and is larger than 25.

15. The method of claim 14, wherein the displacement vector further limits an over-striking repetitions to no more than two times as the array sweeps the surface in one pass.

16. The method of claim 14, wherein the displacement vector is parallel to a line connecting two spots, a first spot projected from a first row in the array in the first position, and a second spot corresponding to one spot in the last row if the used is one unit deeper.

17. The method of claim 14, wherein at least one of a and b is larger than 2N.

18. The method of claim 14, wherein N is larger than 17.

19. The method of claim 14, wherein the array includes more than 300 elements along a shorter axis.

* * * * *